United States Patent
Rossmeisl et al.

(10) Patent No.: US 6,453,810 B1
(45) Date of Patent: *Sep. 24, 2002

(54) METHOD AND APPARATUS FOR DISPENSING MATERIAL IN A PRINTER

(75) Inventors: Mark Rossmeisl, Franklin; Gary T. Freeman, Beverly; Robert Balog, Wrentham, all of MA (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/435,727

(22) Filed: Nov. 8, 1999

Related U.S. Application Data

(63) Continuation-in-part of application No. 09/235,034, filed on Jan. 21, 1999, now Pat. No. 6,324,973, which is a continuation-in-part of application No. 08/966,057, filed on Nov. 7, 1997, now Pat. No. 5,947,022.

(51) Int. Cl.[7] ............... B05C 17/015; B05C 17/005; B41L 13/18; B41L 27/00

(52) U.S. Cl. ............... 101/123; 101/114; 101/129

(58) Field of Search ............... 101/123, 129, 101/114

(56) References Cited

U.S. PATENT DOCUMENTS

| | | | |
|---|---|---|---|
| 2,382,920 A | 8/1945 | Schaefer | 101/120 |
| 2,571,064 A | 1/1951 | Schaefer | 101/120 |
| 3,037,457 A | 6/1962 | Sternlicht | 415/90 |
| 3,097,554 A | 7/1963 | Rice et ak. | 82/59 |
| 3,384,931 A | * 5/1968 | Cockran et al. | 425/128 |
| 3,804,011 A | 4/1974 | Zimmer | 101/114 |
| 3,921,520 A | 11/1975 | Zimmer | 101/120 |

(List continued on next page.)

FOREIGN PATENT DOCUMENTS

| | | | |
|---|---|---|---|
| DE | 3115399 A | * | 4/1982 |
| DE | 19541996 | | 5/1997 |
| EP | 0598182 | | 5/1994 |
| FR | 9612671 | | 8/1996 |
| GB | 2279899 | | 1/1995 |
| GB | 2298393 | | 4/1996 |
| WO | WO96/20088 | | 4/1996 |

OTHER PUBLICATIONS

"Paste Extrusion Head for Screen Printing Apparatus," IBM Technical Disclosure Bulletin, May 1982, vol. 24, Issue 12, pp. 6416–6417.*

"Discrete Solder Apply Technique Utilizing Incompressible Working Fluid," IBM Technical Disclosure Bulletin, May 1991, vol. 33, Issue 12, pp. 422–425.*

Freeman, G., "Screen Print Insurance", Circuits Manufacturing , Apr. 1989, pp. 27–31.

*Primary Examiner*—Daniel J. Colilla
(74) *Attorney, Agent, or Firm*—Mintz, Levin, Cohn, Ferris, Glovsky and Popeo, P.C.

(57) ABSTRACT

A printer for printing a viscous material at predetermined positions forming a pattern on a substrate. The printer includes a frame, a device, mounted to the frame, having a number of perforations arranged to form the pattern, a support apparatus, coupled to the frame, that supports the substrate in a printing position beneath the device, and a material dispenser. The material dispenser has a chamber to contain the viscous material to be printed on the substrate. The chamber has an opening through which the viscous material is dispensed. The material dispenser is coupled to the frame, positioned over the device, and constructed and arranged to dispense the viscous material through the perforations in the device and onto the substrate. The material dispenser has a retraction device that prevents leakage of the viscous material from the opening after dispensing is complete. The material dispenser includes a temperature control system.

30 Claims, 22 Drawing Sheets

U.S. PATENT DOCUMENTS

| | | | |
|---|---|---|---|
| 3,921,521 A | 11/1975 | Kudlich | 101/120 |
| 3,965,817 A | 6/1976 | Ipek | 101/116 |
| 4,023,486 A | 5/1977 | Linthicum et al. | 101/120 |
| 4,043,683 A | 8/1977 | Costa et al. | 401/264 |
| 4,075,089 A | 2/1978 | Saari et al. | 209/169 |
| 4,485,736 A | 12/1984 | Strutz, Jr. et al. | 101/129 |
| 4,622,239 A | 11/1986 | Schoenthaler et al. | 427/96 |
| 4,636,406 A | 1/1987 | Leicht | 427/96 |
| 4,715,278 A | 12/1987 | Ericsson | 101/123 |
| 4,720,402 A | 1/1988 | Wojcik | 427/282 |
| 4,961,955 A | 10/1990 | Goldberg | 427/57 |
| 5,044,306 A | 9/1991 | Erdmann | 101/123 |
| 5,050,496 A | 9/1991 | Klemm | 101/123 |
| 5,287,806 A | 2/1994 | Nanzai | 101/123 |
| 5,309,837 A | 5/1994 | Nanzai | 101/425 |
| 5,364,011 A | 11/1994 | Baker et al. | 228/180.21 |
| 5,395,643 A | 3/1995 | Brown et al. | 427/96 |
| 5,407,488 A | 4/1995 | Ray | 134/6 |
| 5,452,655 A | 9/1995 | Tani | 101/123 |
| 5,553,540 A | 9/1996 | Tani | 101/129 |
| 5,640,907 A * | 6/1997 | Tani et al. | 101/123 |

* cited by examiner

METHOD AND APPARATUS FOR DISPENSING MATERIAL IN A PRINTER

RELATED APPLICATION

This application is a continuation-in-part application of U.S. patent application Ser. No. 09/235,034, now U.S. Pat. No. 6,324,973, filed Jan. 21, 1999, incorporated herein by reference, which is a continuation-in-part application of U.S. patent application Ser. No. 08/966,057, now U.S. Pat. No. 5,947,022, filed Nov. 7, 1997, incorporated herein by reference.

FIELD OF THE INVENTION

The present invention relates to an apparatus and process for dispensing material, and more specifically to an apparatus and process for dispensing solder paste in a screen or stencil printer.

BACKGROUND OF THE INVENTION

In typical surface-mount circuit board manufacturing operations, a stencil printer is used to print solder paste onto a circuit board. Typically, a circuit board having a pattern of pads or some other, usually conductive, surface onto which solder paste will be deposited is automatically fed into the stencil printer and one or more small holes or marks on the circuit board, called fiducials, is used to properly align the circuit board with the stencil or screen of the stencil printer prior to the printing of solder paste onto the circuit board. In some prior art systems, an optical alignment system is used to align the circuit board with the stencil. Examples of optical alignment systems for stencil printers are described in U.S. Pat. No. 5,060,063, issued Oct. 21, 1991 to Freeman, and in U.S. Pat. No. Re. 34,615, issued Jan. 31, 1992, also to Freeman, each of which is incorporated herein by reference.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the board. As the squeegee is moved across the stencil, the solder paste tends to roll in front of the blade, which desirably causes mixing and shearing of the solder paste so as to attain desired viscosity to facilitate filling of the apertures in the screen or stencil. The solder paste is typically dispensed onto the stencil from a standard cartridge such as that manufactured by SEMCO Corporation.

In some prior art stencil printers, any excess solder paste remaining under the squeegee after it has fully traversed the stencil, remains on the stencil when the squeegee is returned to its initial position for printing on a second circuit board. In some prior art screen printers, a second squeegee is used that moves across the stencil in the direction opposite to that of the first squeegee. The first squeegee and the second squeegee are used on alternating boards to continually pass the roll of solder paste over the apertures of a stencil to print each successive circuit board. In the prior art stencil printers that utilize two squeegees, there is still the problem that at the end of a manufacturing day, or when the stencil is to be changed, excess solder paste typically remains on the stencil and must be manually removed. Also, in these prior art printers, it is difficult to maintain a desirable viscosity because volatile solvents escape from the solder paste thereby affecting the viscosity of the solder paste.

In the prior art stencil printers discussed above, the squeegee blades are typically at a predetermined angle with the stencil to apply downward pressure on the solder paste to force the solder paste through the apertures in the stencil as the squeegee is moved across the stencil. The angle of the blade is selected based on the speed at which the blade traverses the stencil and based on the desired downward pressure on the solder paste from the blade. It is desirable to maintain a consistent pressure on the solder paste as the squeegee traverses the stencil, however, in typical prior art printers, the pressure varies due to variations in paste viscosity throughout a production run, and due to variations in the angle of the squeegee caused by deformation of the squeegee due to the pressure applied by the squeegee driving device.

It is desirable to provide a method and apparatus for dispensing material onto a stencil of a printer that overcome the problems discussed above.

SUMMARY OF THE INVENTION

Embodiments of the present invention provide methods for dispensing material and stencil printers having a dispensing apparatus that overcome the problems of the prior art discussed above.

In a first embodiment of the present invention, a printer for printing a viscous material at predetermined positions forming a pattern on a substrate is provided. The printer includes a frame, a device, mounted to the frame, having a number of perforations arranged to form the pattern, a support apparatus, coupled to the frame that supports the substrate in a printing position beneath the device, and a material dispenser having a substantially cylindrical chamber to contain viscous material to be printed on the device. The chamber has an opening through which the viscous material is dispensed. The material dispenser is coupled to a frame, positioned over the device, and constructed and arranged to dispense the viscous material through the perforations in the device and onto the substrate.

Alternate versions of the first embodiment of the present invention include a number of different features. In one version, the material dispenser is constructed and arranged to be movable along a first axis across the device while the viscous material is being dispensed from the chamber. In another version, the chamber has a cylindrical axis extending along a length of the chamber, and the interior surface of the chamber is coated with a coating material having a low coefficient of friction to allow mixing of the viscous material within the chamber when the material dispenser is moved across the device. In alternate embodiments, different coatings having both high and low coefficients of friction may be used on the interior surface of the chamber to enhance the laminar flow of material in the chamber.

In another version of the first embodiment, the printer further includes a heater to heat the viscous material or a cooler to cool the material, and the material dispenser includes at least one port to receive pressurized paste to increase the paste pressure in the chamber to force viscous material from the chamber.

In yet another version of the first embodiment, the material dispenser further includes a pressure sensor that senses pressure within the chamber, and the printer further includes a controller, coupled to the pressure sensor, that senses the pressure within the chamber and maintains the pressure at a desired value.

In another version of the first embodiment, the material dispenser is adapted to receive a removable cartridge, and in some versions, the removable cartridge is a standard SEMCO cartridge.

In still another version of the first embodiment, the material dispenser includes a pair of inwardly facing blades with side dams that contact the device during printing to prevent excess material from accumulating on the device.

In another version of the first embodiment, the printer further includes a solder gathering squeegee arm that collects excess viscous material remaining on the device when the material dispenser is lifted off of the device.

In a second embodiment of the present invention, a printer for printing a viscous material at predetermined positions forming a pattern on a substrate is provided. The printer includes a frame, a device, mounted to the frame, having a number of perforations arranged to form a pattern, a support apparatus that supports the substrate in a printing position beneath the device, and a material dispenser having a chamber to contain the viscous material to be printed on the substrate. The chamber has an opening through which the viscous material is dispensed. The material dispenser is positioned over the device, constructed and arranged to dispense the viscous material through the perforations in the device and onto the substrate, and adapted to receive a removable cartridge that supplies the viscous material to the chamber. The chamber has an inlet adapted to receive the viscous material from the removable cartridge.

Alternate versions of the second embodiment of the present invention may include one or more of the features of versions of the first embodiment discussed above.

A third embodiment of the present invention provides a material dispenser for dispensing a viscous material onto a stencil of a printer. The material dispenser includes a substantially cylindrical chamber to contain the viscous material. The chamber has an opening through which the viscous material is dispensed. The material dispenser also includes a pair of inwardly facing blades and side dams mounted on the material dispenser in close proximity to the opening. The blades are adapted to contact the stencil during printing to prevent excess material from remaining on the device.

In one version of the material dispenser, an interior surface of the chamber is coated with a coating material having a low coefficient of friction to allow mixing of the viscous material within the chamber when the material dispenser is moved across the device.

A fourth embodiment of the present invention provides a printer for printing a viscous material at predetermined positions forming a pattern on a substrate. The printer includes a frame, a device, mounted to the frame, having a number of perforations arranged to form the pattern, a support apparatus, coupled to the frame, that supports the substrate in a printing position beneath the device and a material dispenser having a chamber to contain the viscous material to be printed on the substrate. The chamber has an opening through which the viscous material is dispensed. The material dispenser is coupled to the frame, positioned over the device, and constructed and arranged to dispense the viscous material through the perforations in the device and onto the substrate. The material dispenser has a retraction device that prevents leakage of the viscous material from the opening after dispensing is complete.

In one version, the retraction device includes at least one plunger that is extendable into the chamber to vary the volume of the chamber, and the retraction device can include an actuator coupled to the plunger to control movement of the plunger. The actuator may have a first air inlet and a second inlet, and the actuator can be constructed and arranged to provide movement of the plunger in a first direction upon the application of pressurized air at the first inlet and to provide movement of the plunger in a second direction upon the application of pressurized air at the second inlet.

In versions of the fourth embodiment, the material dispenser can include at least one port to receive pressurized air to provide air pressure to the chamber to force the viscous material from the chamber during dispensing, and the material dispenser can include a pressure sensor to sense pressure within the chamber, and the printer can further include a controller coupled to the pressure sensor that senses the pressure within the chamber and controls the pressurized air provided through the port to maintain the pressure within the chamber at a desired value. The printer can be adapted to receive a removable cartridge that supplies the viscous material to the chamber, and the chamber can have an inlet to receive the viscous material from the removable cartridge. The pressurized air can be provided to the cartridge to force the viscous material from the cartridge into the chamber.

In a fifth embodiment, a printer is provided for printing a viscous material at predetermined positions forming a pattern on a substrate. The printer includes a frame, a device, mounted to the frame, having a number of perforations arranged to form the pattern, a support apparatus, coupled to the frame, that supports the substrate in a printing position beneath the device, and a material dispenser having a chamber to contain the viscous material to be printed on the substrate. The chamber has an opening through which the viscous material is dispensed, and the material dispenser is coupled to the frame, positioned over the device, and constructed and arranged to dispense the viscous material through the perforations in the device and onto the substrate. The printer also includes means for retaining the viscous material in the chamber after dispensing is complete.

In versions of the fifth embodiment, the means for retaining include means for increasing a volume of the chamber, and the material dispenser is adapted to receive a removable cartridge that supplies the viscous material to the chamber, the chamber having an inlet to receive the viscous material from the removable cartridge. The printer can further include means for applying pressure to the viscous material in the cartridge to force viscous material into the chamber from the cartridge and to force viscous material from the chamber through the opening.

In a sixth embodiment of the present invention, a method is provided for printing a pattern of viscous material on a substrate using a dispenser having a chamber with an inlet to receive viscous material and an outlet from which viscous material is dispensed. The method includes steps of positioning the dispenser over the substrate, applying pressure to the viscous material in the chamber to dispense viscous material from the outlet of the chamber onto the substrate, relieving the pressure applied to the viscous material to discontinue dispensing, and expanding the volume of the chamber to retain the viscous material in the chamber.

The method of the sixth embodiment can further include steps of decreasing the volume of the chamber prior to dispensing material onto the substrate, and coupling a removable cartridge containing the viscous material to the dispenser such that an outlet of the removable cartridge is coupled to the inlet of the chamber. In versions of the sixth embodiment, in the step of applying pressure, air pressure is supplied to the removable cartridge.

In a seventh embodiment of the present invention, a closed loop pressure control system is provided to maintain the pressure of the chamber of the dispensing head to a desired value during printing. The pressure control system includes a pressure transducer mounted in the dispensing head to measure real-time pressure in the chamber at a multiple of predetermined time intervals during the print stroke of the dispensing head. The pressure transducer provides an output signal to a programmable regulator which determines the presence of a pressure differential from a predetermined desired pressure value received from the stencil printer controller. In response to a pressure differential, the programmable regulator increases or decreases the pressurized air delivered to the cartridges during the print stroke. Through control of the pressurized air applied to the cartridges, the programmable regulator controls the pressure of the chamber of the dispensing head to the desired value.

In a version of the seventh embodiment of the present invention, the stencil printer features a bracket mounted to the printer adjacent to the dispensing head which features a universal pressure connection configuration. The universal pressure connection configuration includes a pressure connection mounted on the bracket for connection to similarly configured and arranged connectors of air lines which deliver pressurized air to the cartridges and the actuators of the retraction system. The pressure connection is universal in the sense that it permits the use of different types of dispensing heads which incorporate different pneumatic assemblies and configurations, such as the dispensing head of the present invention and a dispensing head which features one or more squeegee blades, with the stencil printer. The universal pressure connection permits a quick and easy in-process replacement of one type of dispensing head for another, thereby reducing the time required to change dispensing heads. The universal pressure connection configuration results in less production downtime and greater efficiency of the stencil printer.

In an eighth embodiment of the present invention, a temperature control system is provided to control the temperature of the viscous material contained in the chamber of the dispensing head. The temperature control system includes a temperature sensor or thermistor mounted in the dispensing head which measures the temperature of the viscous material. The thermistor provides a signal to a PID controller which determines the presence of a temperature differential from a predetermined desired temperature value received by the printer controller. Depending upon the temperature differential determined, the PID controller indicates to a thermoelectric device disposed at each terminal end of the dispensing head to either heat or cool a conduction rod. The conduction rod is an elongated, insulated rod disposed in the chamber of the dispensing head and coupled at each terminal end to a thermoelectric device. Each thermoelectric device is also coupled to a heat exchanger with a cooling fan which assists in removing heat from the chamber of the dispensing head by convection cooling. The temperature control system maintains the temperature of the viscous material contained in the chamber of the dispensing head to ±0.2° C. of the desired value.

In a ninth embodiment of the present invention, the dispensing head is equipped with a device which prevents leakage of the viscous material from the chamber after the dispensing head has completed a print stroke or when the dispensing head is lifted from the stencil or substrate. In one version of the ninth embodiment, the device is a blocking assembly disposed in the dispensing head for use in the application of adhesives to substrates. The blocking assembly is mounted to the housing and replaces the retraction system of prior embodiments. The blocking assembly includes an elongated mounting bracket with a plurality of plungers mounted thereon. The blocking assembly conforms to the upper surface of the chamber to prevent leakage of adhesive from the chamber.

In another version of the ninth embodiment of the present invention, the device which prevents leakage of the viscous material from the chamber of the dispensing head is a material holding plate for use with low viscosity materials. Low viscosity materials may not respond as effectively to the negative chamber pressure created by the retraction system and may leak from the dispensing head when the dispensing head is lifted from the stencil or substrate after printing is accomplished. The material holding plate is an elongate, planar member having an upper surface and a lower surface with a plurality of apertures or through-holes. The material holding plate is disposed in the chamber of the dispensing head by sliding the material holding plate into the chamber and matching angled sides of the material holding plate with an interface of a chamber side wall and a squeegee blade mounted to the dispensing head. The material holding plate effectively retains low viscosity materials in the dispensing head and reduces residual viscous material on a stencil or substrate.

In a tenth embodiment of the present invention, the cartridges are mounted to the housing of the dispensing head by stainless steel removable fittings which quickly and easily mount and remove the cartridges from the housing. Each removable fitting includes a smooth insert which couples with a port in the housing having a smooth side wall. Each removable fitting also includes a spring-biased plunger which couples with a stainless steel pad permanently affixed adjacent to the port on the housing. The coupling of the spring-biased plunger and the stainless steel pad creates a secure attachment of the removable fitting to the housing. Each removable fitting eliminates the use of threaded tap fittings and ports for mounting the cartridges which are difficult to clean and require more time to mount the cartridges to the housing.

In addition, each removable fitting enables the cartridges to be mounted to the housing in a vertically and horizontally consistent position in relation to the proximity detector. The proximity detector, as described above, detects the level of paste contained in the cartridge. The consistent position of the cartridge in relation to the proximity detector eliminates erroneous measurements of paste level and permits more reliable paste level detection between cartridges concurrently mounted to the housing and between manufacturing production runs.

In an eleventh embodiment of the present invention, a method is provided to control pressure in the chamber of the material dispenser of the printer. The method includes the steps of applying pressurized air to the chamber from an external source, measuring the pressure of the chamber after at least one predetermined time interval as the material dispenser traverses a stencil or substrate, and either increasing or decreasing the amount of pressurized air applied to the material dispenser in response to detecting a pressure differential between the measured pressure and a predetermined desired pressure to maintain the desired pressure of the chamber.

In a twelfth embodiment of the present invention, a method is provided to control the temperature of the viscous material contained in the chamber of the material dispenser. The method includes the steps of measuring a temperature of the viscous material contained in the chamber, detecting a temperature differential between the measured temperature and a predetermined desired temperature and, in response to the temperature differential, either applying a sufficient amount of heat to increase the temperature the viscous material or removing a sufficient amount of heat to reduce the temperature of the viscous material to maintain the viscous material at the desired temperature.

BRIEF DESCRIPTION OF THE DRAWINGS

For a better understanding of the present invention, reference is made to the drawings which are incorporated herein by reference and in which.

DETAILED DESCRIPTION

For purposes of illustration, embodiments of the present invention will now be described with reference to a stencil printer used to print solder paste onto a circuit board. One skilled in the art will appreciate, however, that embodiments of the present invention are not limited to stencil printers that print solder paste onto circuit boards, but rather, may be used in other applications requiring dispensing of other viscous materials such as glues and encapsulents. Further, stencil printers in accordance with embodiments of the present invention are not limited to those that print solder paste on circuit boards, but rather, include those used for printing other materials on a variety of substrates. Also, the terms screen and stencil may be used interchangeably herein to describe a device in a printer that defines a pattern to be printed onto a substrate.

Figure 1:
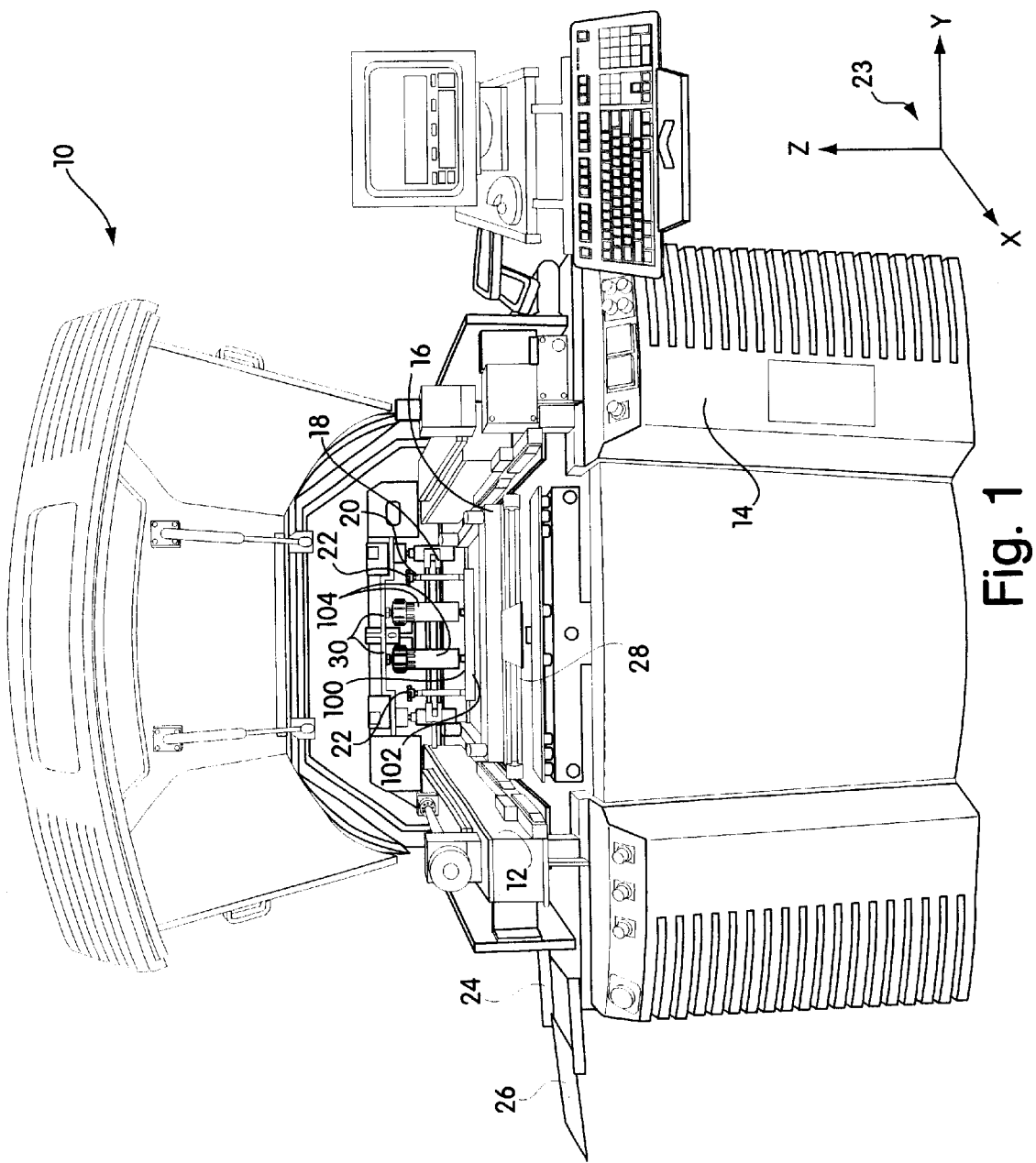
FIG. 1 provides a front view of a stencil printer in accordance with one embodiment of the present invention.
Figure 2:
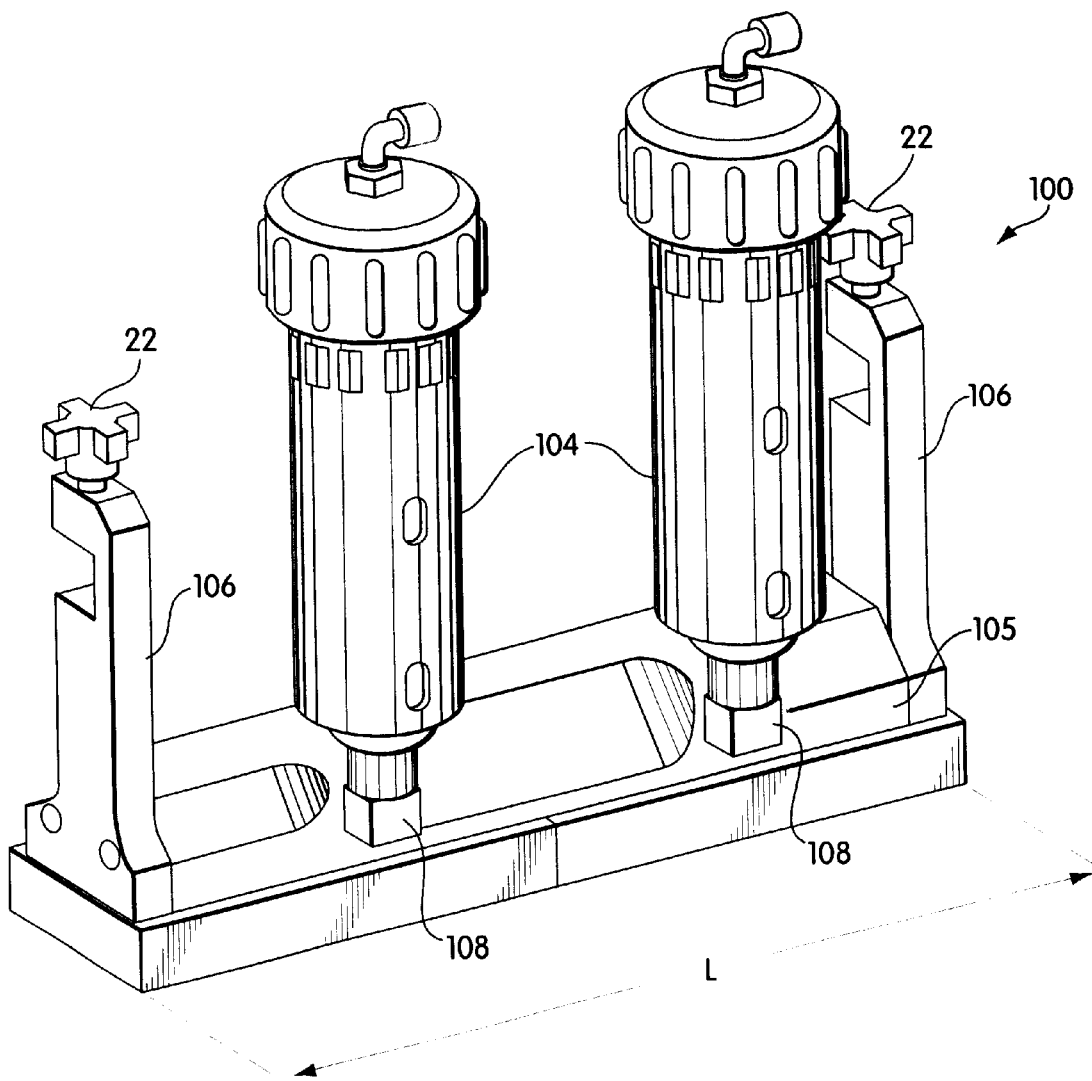
FIG. 2 provides a perspective view of a material dispensing head used in the stencil printer of FIG. 1.
Figure 3:
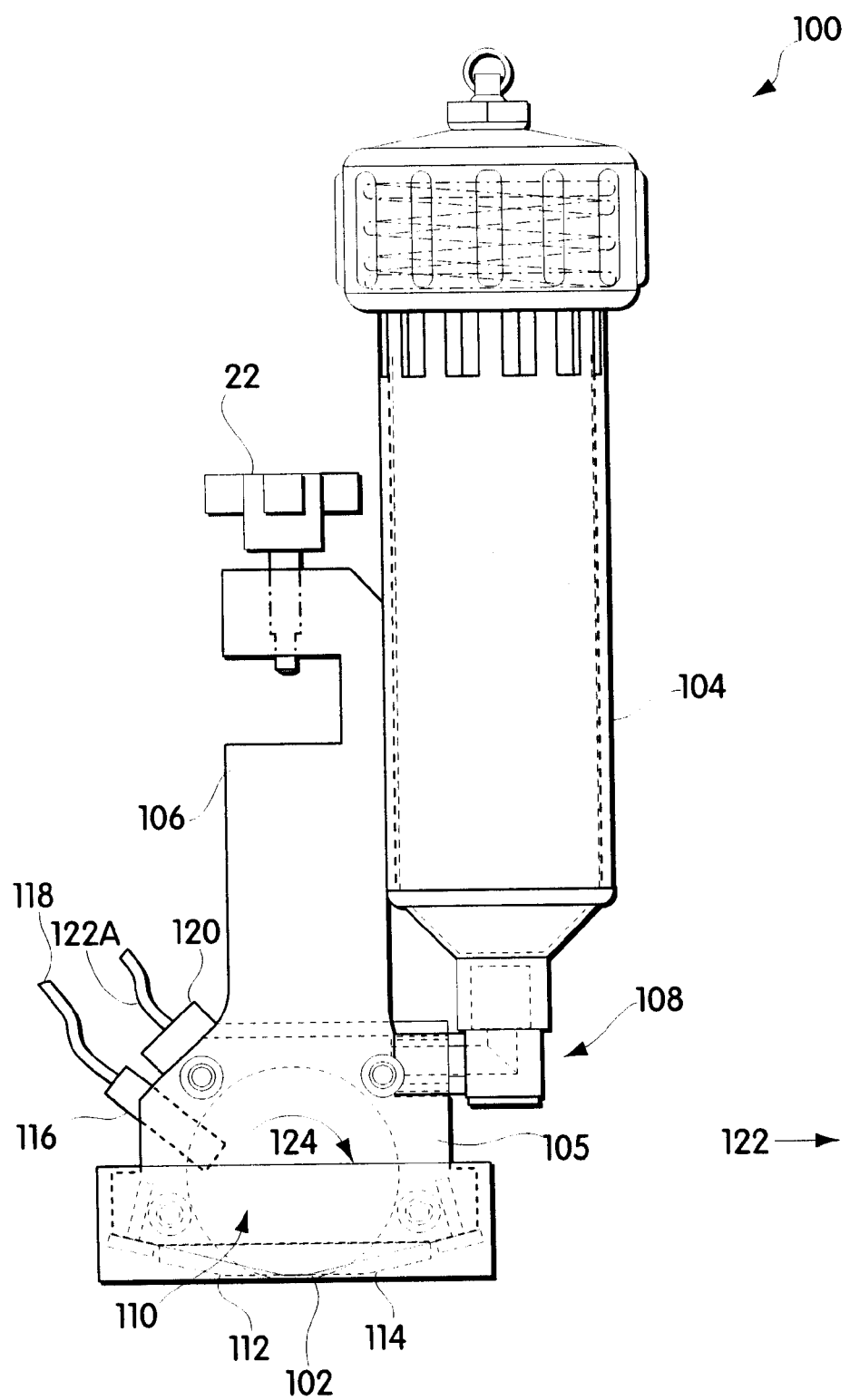
FIG. 3 provides a cross-sectional side view of the material dispensing head shown in FIG. 2.
Figure 4:
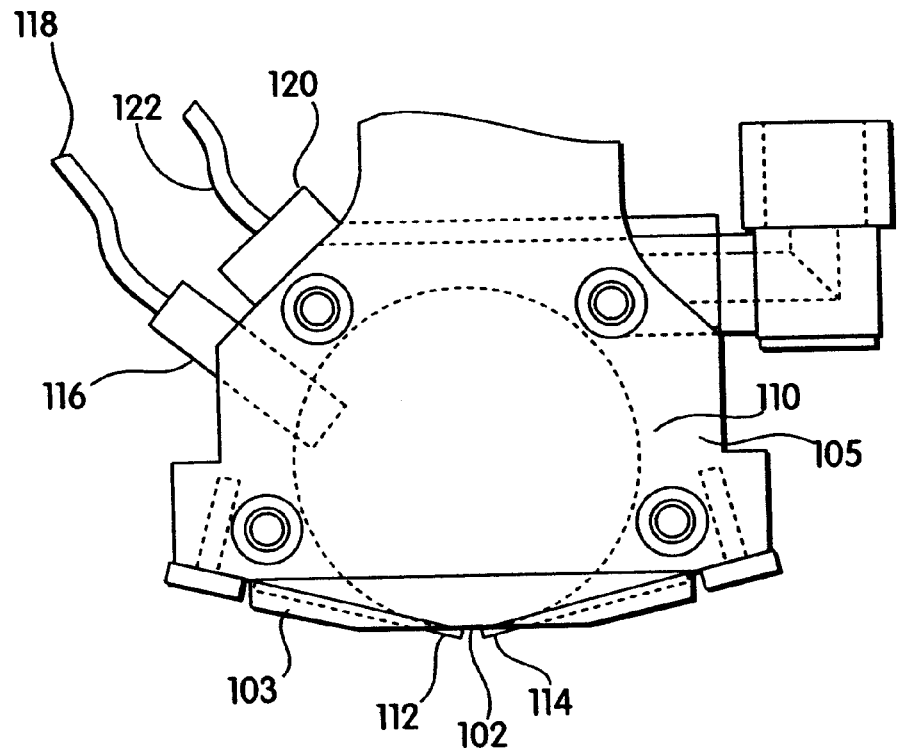
FIG. 4 shows a close up side view of a chamber of the material dispenser of FIG. 2.
Figure 5:
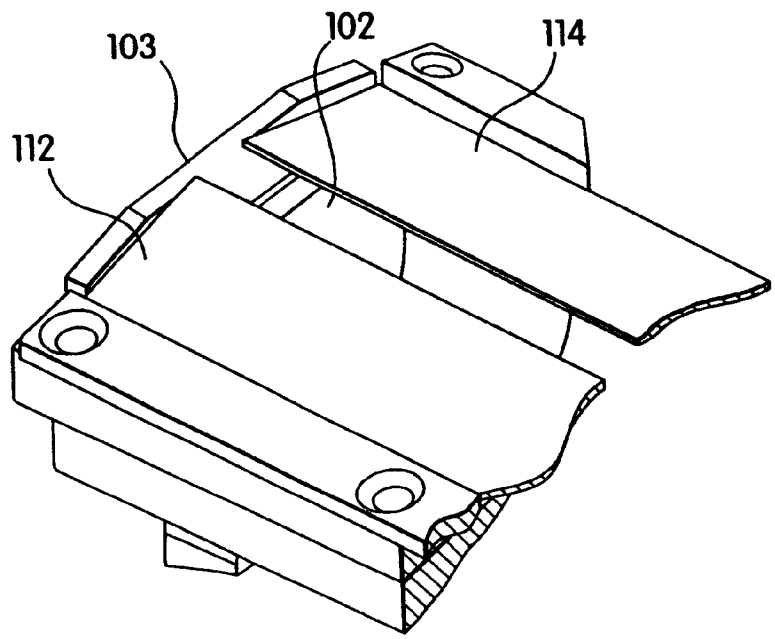
FIG. 5 shows a bottom view of the material dispenser in greater detail.

FIG. 1 shows a front view of a stencil printer 10 in accordance with one embodiment of the present invention. The stencil printer 10 includes a frame 12 that supports components of the stencil printer including a controller 14, a stencil 16, and a dispensing head 100 having a dispensing slot 102 from which solder paste may be dispensed.

The dispensing head 100 is coupled to a first plate 18 using two thumbscrews 22. The first plate 18 is coupled to a second plate 20 which is coupled to the frame 12 of the stencil printer 10. The first plate 18 is coupled to the second plate 20 in such a manner that the first plate can be moved with respect to the second plate along a z axis, the z axis being defined by the coordinate axis system 23 shown in FIG. 1. The first plate is moved by motors under the control of the controller 14.

The second plate 20 is movably coupled to the frame 12 such that the second plate 20 can move with respect to the frame 12 along an x axis, the x axis also being defined by the coordinate axis system 23. As described below in further detail, the movements of the first and second plates allow the dispensing head 100 to be placed over the stencil 16 and moved across the stencil to allow printing of solder paste onto a circuit board.

Stencil printer 10 also includes a conveyor system having rails 24 for transporting a circuit board 26 to a printing position in the stencil printer. The stencil printer has a number of pins 28, positioned beneath the circuit board when the circuit board is in the dispensing position. The pins are used to raise the circuit board 26 off of the rails 24 to place the circuit board in contact with, or in close proximity to, the stencil 16 when printing is to occur.

The dispensing head 100 is configured to receive two standard SEMCO three ounce or six ounce solder paste cartridges 104 that provide solder paste to the dispensing head during a printing operation. Each of the solder paste cartridges 104 is coupled to one end of a pneumatic air hose 30. As readily understood by those skilled in the art, the dispensing head could be adapted to receive other standard, or non-standard, cartridges. The other end of each of the pneumatic air hoses is attached to a compressor that under the control of the controller 14 provides pressurized air to the cartridges to force solder paste to flow from the cartridges into the dispense head 100 and onto the screen 16. Mechanical devices, such as a piston, may be used in addition to, or in place of, air pressure to force the solder paste from the SEMCO cartridges into the dispensing head.

In one embodiment of the present invention, the controller 14 is implemented using a personal computer using the Microsoft DOS or WINDOWS® NT operating system with application specific software to control the operation of the stencil printer as described herein.

The stencil printer 10 operates as follows. A circuit board 26 is loaded into the stencil printer using the conveyor rails 24. The dispensing head is then lowered in the z direction until it is in contact with the stencil 16. Pressurized air is provided to the cartridges 104 while the dispensing head is moved in the x direction across the stencil 16. The pressurized air forces solder paste out the cartridges. and creates pressure on the solder paste in the dispensing head forcing solder paste from the dispensing slot of the dispensing head through apertures in the stencil 16 and onto the circuit board 26. Once the dispensing head 100 has fully traversed the stencil 16, the circuit board is lowered back onto the conveyor rails 24 and transported from the printer so that a second circuit board may be loaded into the printer. To print on the second circuit board, the dispensing head is moved across the stencil in the direction opposite to that used for the first circuit board. Alternatively, a squeegee arm (as described below) could swing in to contain the solder paste in the dispenser, and the dispenser can then be lifted in the z direction and moved back to its original position to prepare to print on the second circuit board using a similar direction stroke. Further description of the operation and construction of the dispensing head 100. are provided below with reference to FIGS. 2–5.

The dispensing head 100 includes a housing 105 coupled to two supporting arms 106. At one end of each of the supporting arms 106 are thumbscrews 22 that provide for easy removal and installation of the dispensing head 100. The housing 105 has two ports 108 that are adapted to receive a standard SEMCO solder paste cartridge. In the illustrative embodiment described herein, the dispensing head is adapted to receive two SEMCO cartridges, however, the dispensing head may be adapted to include more or less cartridges than the two shown herein. The number of cartridges used is selected based on the length L of the dispensing head and the capacity of the cartridge used. The length L is determined in part based on the width of the circuit boards to be printed upon. If the size of the circuit board changes, then the dispensing head may be replaced by a new dispensing head having a length L sized for the new circuit boards. The effective length of the slot 102 may also be reduced to accommodate smaller circuit boards by partially covering a portion of the slot.

The housing 105 includes a cylindrical chamber 110 in which solder paste received from the SEMCO cartridges is stored prior to being dispensed onto the stencil. In one embodiment, the interior walls of the chamber 110 are coated with a material having a low coefficient of friction. Other materials, having a wide range of coefficients of friction, are used for the coating to create a desired laminar flow of solder paste in the chamber. In one embodiment, a number of different coatings having a variety of coefficients of friction may be used to create the desired laminar flow. At the slot 102, the housing has two inwardly facing blades 112 and 114. Each of the inwardly facing blades has a length approximately equal to the length L of the slot, a width equal to approximately 0.38 inches, and a thickness of approximately 0.004 to 0.010 inches. Each of the blades 112 and 114, in one embodiment of the present invention, is made from spring steel. At each end of the blades is a side dam 103. While other materials such as plastic could be used to make the blades, the use of spring steel provides long life with continued resiliency. Each of the blades is arranged to provide an angle of approximately 15 degrees between the blade and the top surface of the stencil. Depending in part on the material used to make the blades and the speed at which the material dispenser traverses the stencil, the blades could be oriented at angles other than 15 degrees.

The dispensing head 100, in one embodiment of the present invention, further includes a pressure sensor 116 and a temperature controller 120. Incorporated within the temperature controller is a thermoelectric device and a temperature sensor. The pressure sensor 116 and the temperature controller 120 are coupled to the controller 14 through cables 118 and 122A respectively. The controller 14 is configured to measure the pressure and the temperature of the solder paste within the chamber 110 based on signals received from the sensors, and the controller controls the pressure and temperature by adjusting the force applied to the solder paste in the cartridges and by controlling the thermoelectric device contained in the temperature controller. In one embodiment, the pressure of the solder paste is maintained in the chamber by applying pressurized air at approximately 1–25 pounds per square inch to each of the cartridges 104. The temperature of the solder paste in the chamber is maintained during the printing operation at approximately 68 degrees Fahrenheit. In one embodiment, the pressure sensor is implemented using a pressure transducer with a programmable regulator and the temperature controller is implemented using a temperature probe with a thermoelectric device that can provide cooling as well as heating of the solder paste.

As discussed above, when the dispensing head is in the lowered printing position so that it is in contact with the stencil, the stencil printer 10 operates by forcing solder paste from the dispensing head 100 onto the stencil using air pressure applied to each of the SEMCO cartridges as the dispensing head moves across the stencil. In the printing position, the blades 112 and 114 contact the top surface of the stencil. For each direction that the dispensing head moves across the stencil, one of the blades 112 and 114 will be a trailing blade and will scrape any excess solder paste off the stencil. For example, when the dispensing head 100 moves in the direction of arrow 122 in FIG. 3, blade 112 will be the trailing blade removing any excess solder paste from the stencil. The orientation of the blades and the use of a cylindrical chamber in the dispensing head causes the solder paste within the chamber 110 to roll or flow in the direction of arrow 124 when the dispensing head is moved in the direction of arrow 122. The movement of the solder paste within the chamber causes mixing and shearing of the solder paste which helps to maintain the desired temperature and viscosity of the solder paste. The coating for the internal walls of the chamber 110 allows the solder paste to move freely within the chamber.

At the conclusion of printing, when it is desired to lift the dispensing head off of the stencil, the controller 14 turns off the pressurized air source, prior to lifting the dispensing head. This causes the solder paste to remain in the chamber 110 when the dispensing head is lifted and effectively reduces the amount of solder paste that is left on the stencil when printing is complete.

Figure 6:
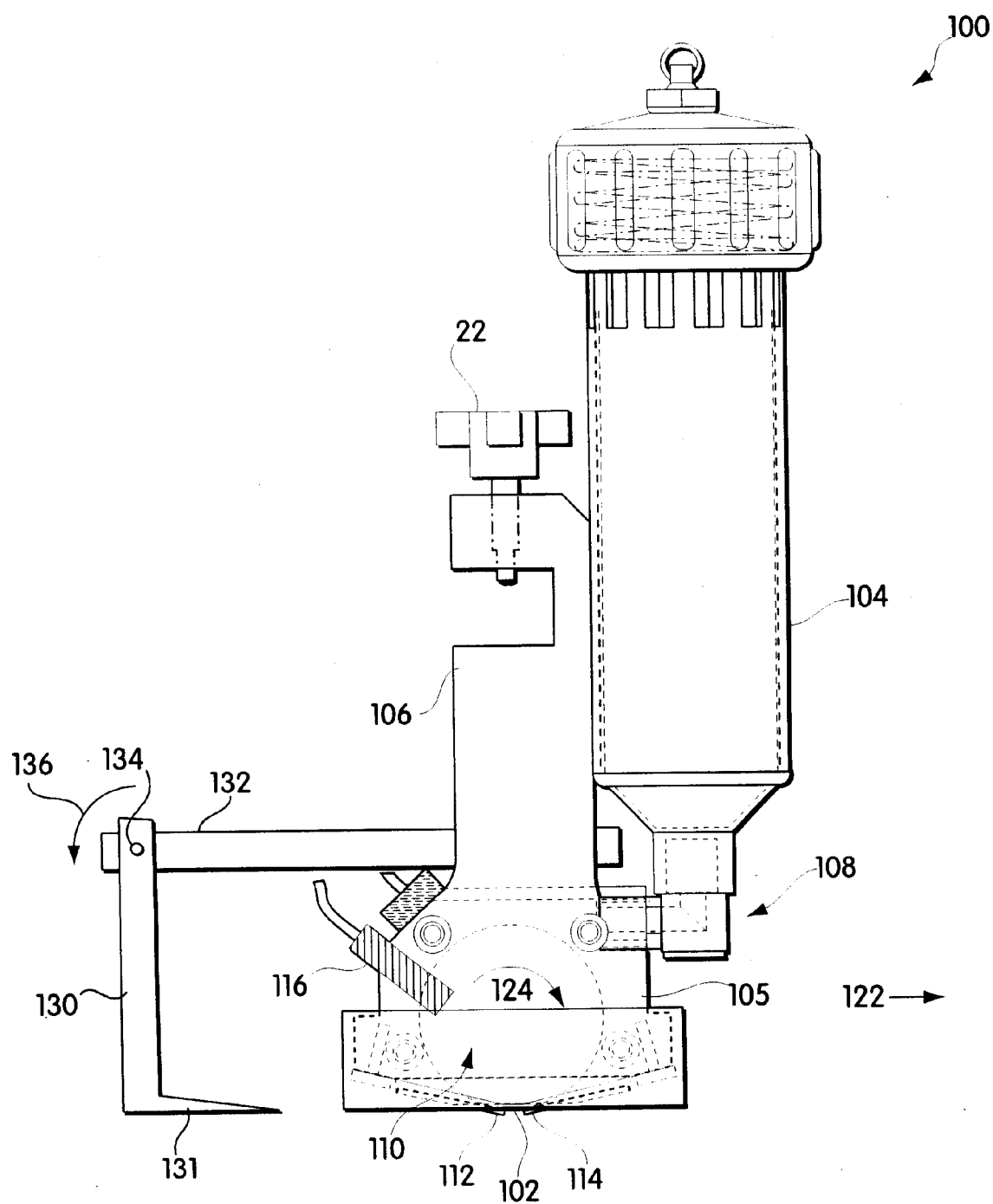
FIG. 6 shows a side view of the material dispenser with a solder gathering arm.

To further reduce the amount of residual solder paste on the stencil, a solder gathering squeegee arm may be used to remove excess solder paste. One example of a solder gathering squeegee arm that could be used in embodiments of the present invention is described in U.S. Pat. No. 5,044,306, which is incorporated herein by reference. FIG. 6 shows a solder gathering arm 130 incorporated into the dispensing head 100. The solder gathering arm includes a squeegee 131. The solder gathering arm is mounted to a bracket 132 which in turn is mounted to one or both of the supporting arms 106. The solder gathering arm is mounted to the bracket 132 using a rotatable joint 134, and the bracket 132 is movable with respect to the supporting arms 106 in the direction shown by arrow 122.

The solder gathering arm operates as follows When the dispensing head 100 is lifted slightly off of the stencil, the bracket 132 is moved in the direction of arrow 122, and the solder gathering arm is rotated in the direction shown by arrow 136 causing the squeegee 131 to scrape along the stencil and remove any excess solder on the stencil. The rotation of the solder gathering arm and the movement of the bracket 132 is accomplished using motors or actuators under the control of the controller 14.

In embodiments of the present invention, instead of using the solder gathering arm, the blades 112 and 114 may be attached to motors or actuators that under the control of the controller cause the blades to move towards each other, scraping any excess solder paste from the screen and completely closing the slot 102. Alternatively, a pair of movable blades, in addition to blades 112 and 114, may be mounted to the dispensing head and be movable towards each other to scrape excess solder paste from the stencil.

Figure 7:
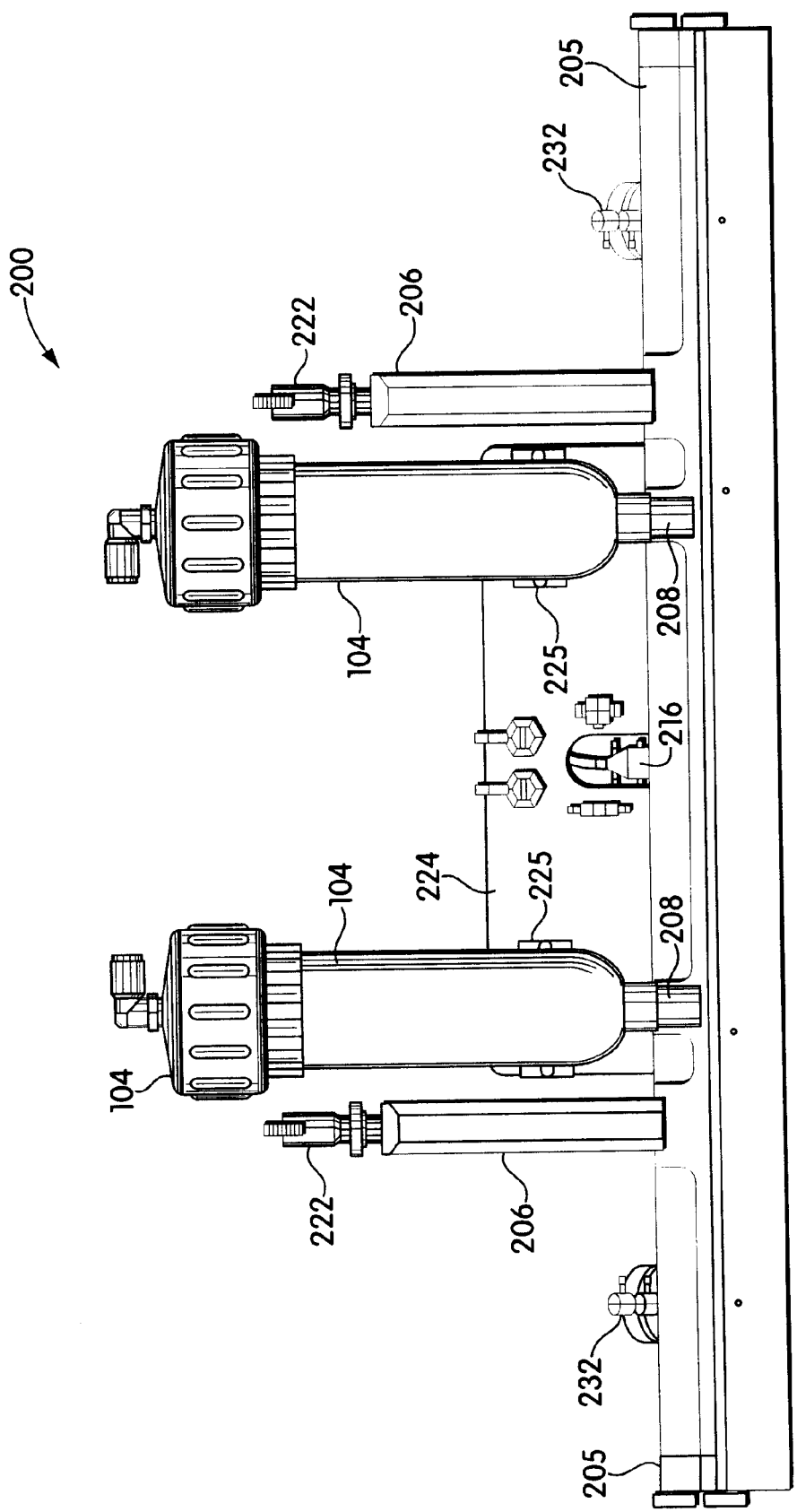
FIG. 7 shows a front view of another embodiment of a dispensing head used in the stencil printer of FIG. 1.
Figure 8:
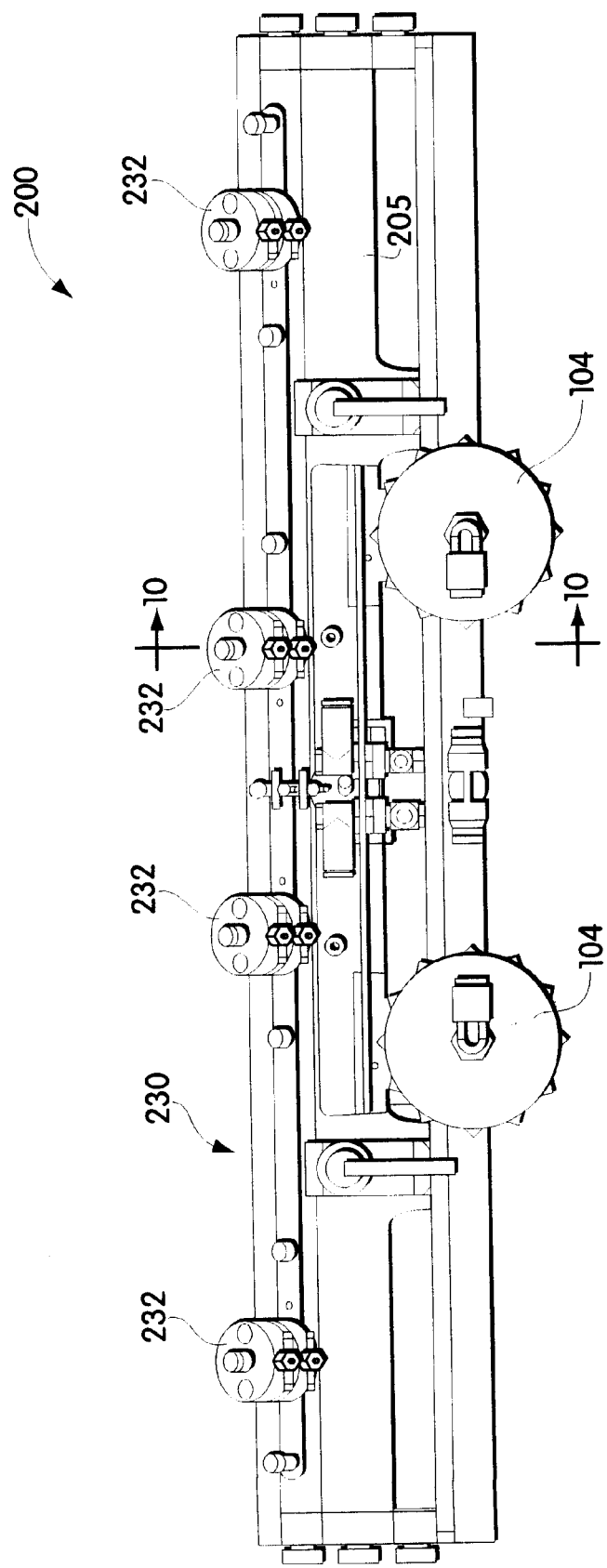
FIG. 8 shows a top view of the dispensing head of FIG. 7.
Figure 9:
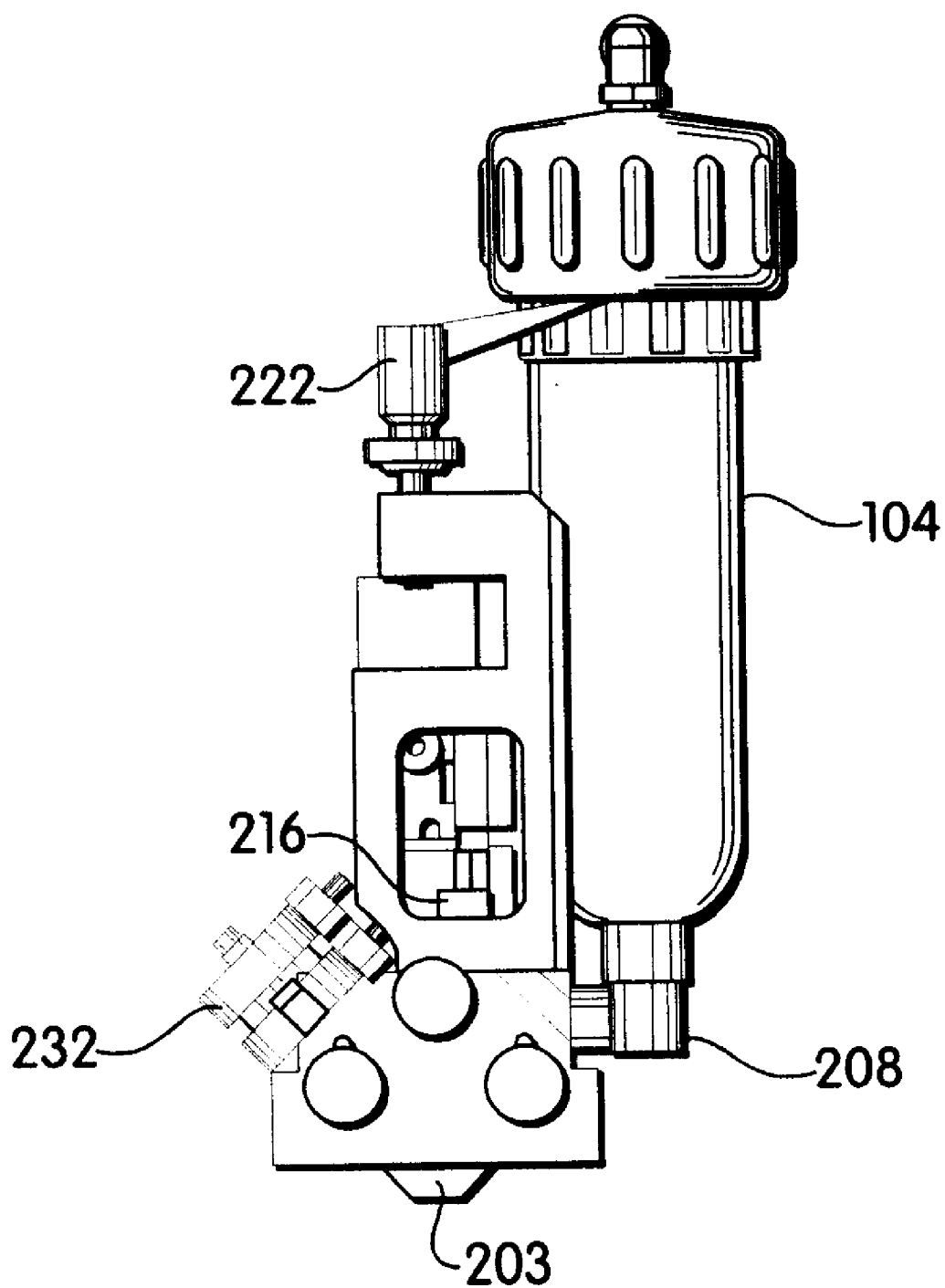
FIG. 9 shows a side view of the dispensing head of FIG. 7.
Figure 10:
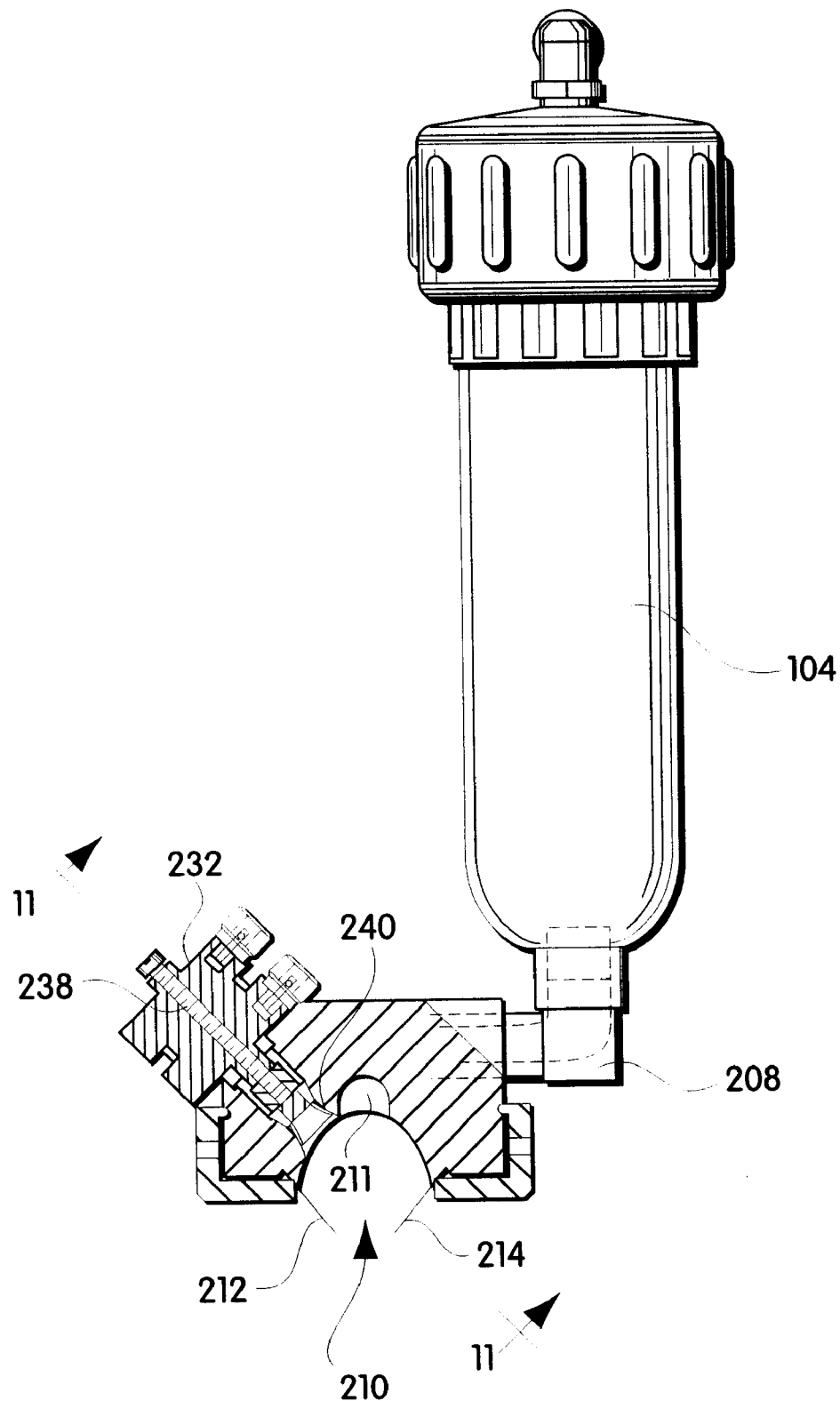
FIG. 10 shows a cross-sectional side view of the dispensing head taken along line 10—10 of FIG. 8.

In another embodiment of the present invention, which will now be described with reference to FIGS. 7–13, pressure is reduced within the chamber of a dispensing head to draw excess solder paste into the chamber at the conclusion of printing. FIG. 7 shows a side view of a dispensing head 200 in accordance with this embodiment of the invention. The dispensing head 200 is similar to dispensing head 100 and is mounted to the printer using two thumb screws 222 coupled to two supporting arms 206. The dispensing head 200, like dispensing head 100, is designed to accommodate two standard solder paste cartridges 104, which are mounted to ports 208. The dispensing head includes a bracket 224 to which conductive proximity switches 225 are mounted. The conductive proximity switches detect when the solder paste level in the cartridges drops below a predetermined level, and at that time, further printing is prevented and an indication is provided to an operator of a low solder paste condition. In one embodiment, the conductive proximity switches are implemented using switches capable of detecting a conductive material, such as those available from Omron Corporation underpart no. E2K-F10MC2. In other embodiments, more or less solder paste cartridges may be used.

Figure 11:
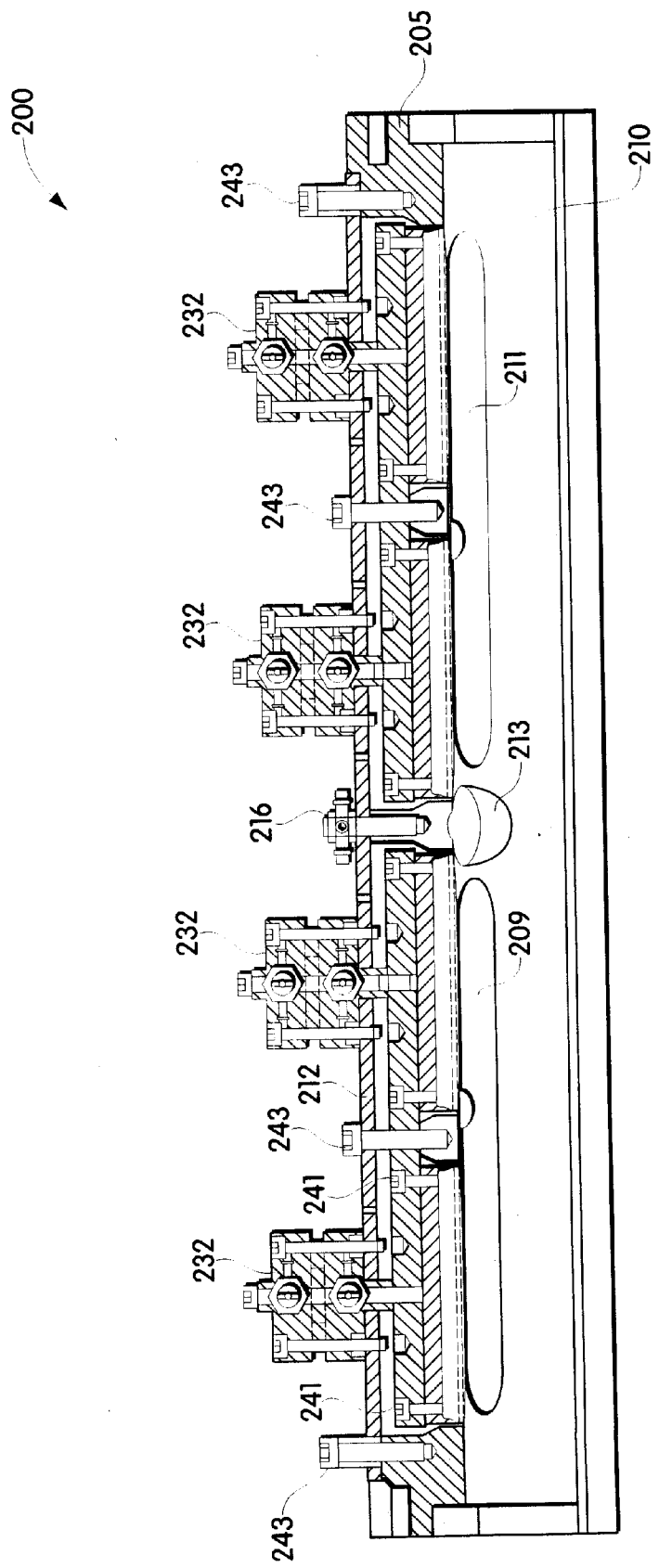
FIG. 11 shows a cross-sectional view taken along line 11—11 of FIG. 10.
Figure 12:
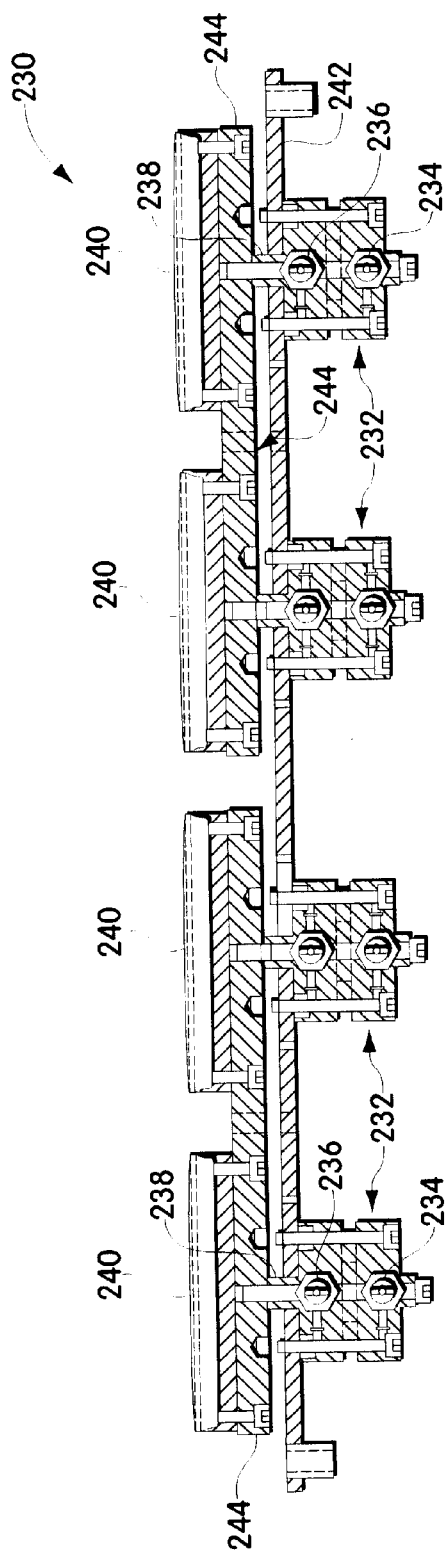
FIG. 12 shows a side view of a retraction assembly used in the dispensing head of FIG. 7.
Figure 13:
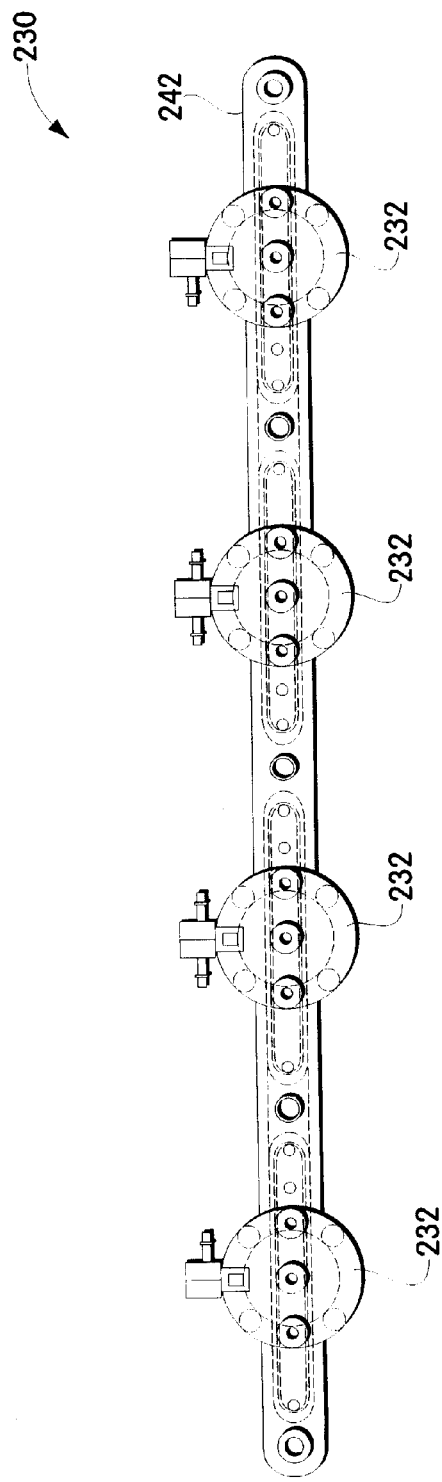
FIG. 13 shows a top view of the retraction assembly of FIG. 12.

The dispensing head 200 has a housing 205 containing a cylindrical chamber 210. The housing has two ports 208 for passing solder paste from the cartridges 104 into the cylindrical chamber 210. Similar to dispensing head 100, dispensing head 200 has blades 212 and 214 and side dams 203. In one embodiment, the side dams have a lower portion and an upper portion. The lower portion is formed from a relatively rigid material (such as urethane having a durometer of 70 shore D) to prevent wear, while the upper portion is made from a more compliant material (such as urethane having a durometer of 10–15 shore A) to allow slight compression of the side dams as the dispensing head is moved across the stencil. In addition, the dispensing head 200 has a pressure sensor 216 to detect pressure in the chamber 210 and a temperature sensor to detect temperature of the solder paste in the chamber. Within the housing, as best seen in FIG. 11, adjacent to the chamber are channels 209, 211 and 213. Channels 209 and 211 are used to more evenly distribute solder paste from the cartridges through the ports 208 to the chamber and channel 213 enables the pressure sensor 216 to measure pressure within the chamber.

Dispensing head 200 differs from dispensing head 100 in that it includes a solder paste retraction assembly 230. As described below in greater detail, after the completion of printing on a substrate, the solder paste retraction assembly causes the effective volume of the chamber 210 to increase to create a negative pressure within the chamber which causes excess solder paste to be retracted into the chamber.

The retraction assembly 230 includes four actuators 232 having pistons 238 coupled to two plunger mounting brackets 244. Each of the plunger mounting brackets 244 is coupled to two elongated, unshaped plungers 240 using screws 241. Each of the actuators is mounted to an actuator mounting bracket 242 which is mounting to the housing 205 using screws 243.

Figure 14:
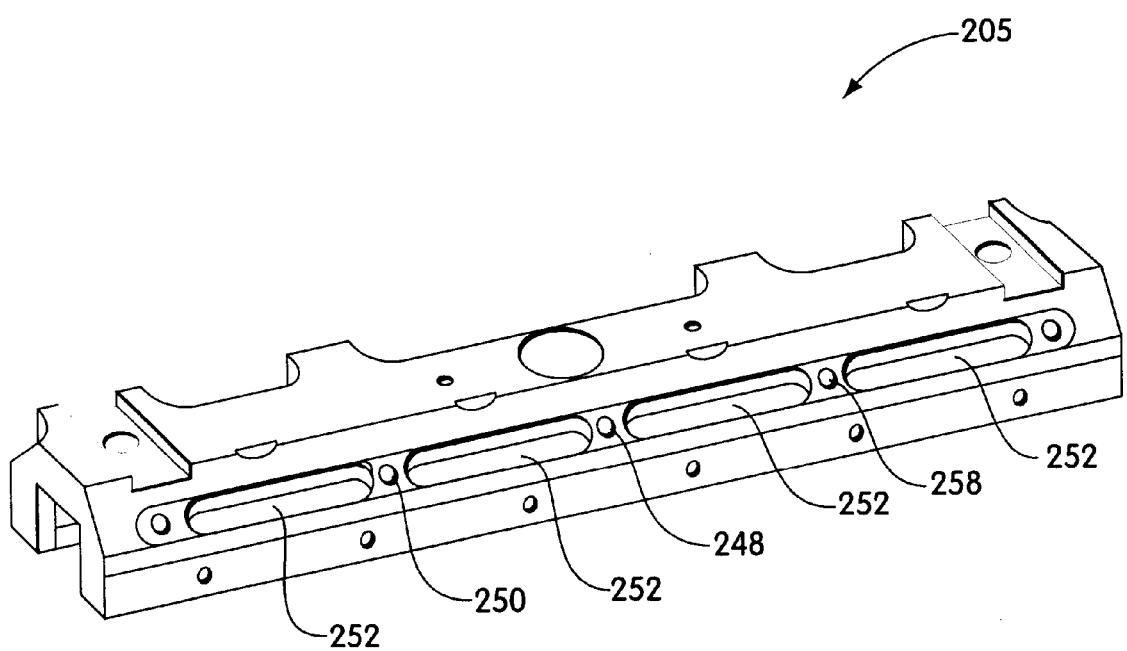
FIG. 14 shows a perspective view of the housing of the dispensing head of FIG. 7 with the retraction assembly removed.

As best seen in FIG. 14, which shows the housing 205 with the retraction assembly and cartridges removed, the housing 205 has an upper channel 248, two intermediate channels 250 and four lower slots 252. The upper channel extends across the housing and is sized to accommodate the actuator bracket 242. The two intermediate channels 250 are formed within the actuator channel and are sized to accommodate the plunger mounting brackets 244. Two of the four lower slots 252 are formed in each of the intermediate channels 250. Each of the lower slots is sized to accommodate one of the plungers 240.

In one embodiment of the present invention the actuators are implemented using double acting, pancake air cylinders having a 9/16 inch diameter and a 1/8 inch stroke, available from Bimba of Monee, Ill. under part no. FOD-020.125-H. These actuators have two pressurized air inlet ports 234 and 236 that in embodiments of the present invention are coupled to controllable sources of pressurized air to control movement of the pistons 238. Pressurized air is provided to inlet ports 234 of the actuators to extend the pistons, and pressurized air is provided to inlet ports 236 to retract the pistons.

In one embodiment, the u-shaped plungers are made from a resilient material such as urethane having a durometer of 65–70 shore D. In other embodiments other materials may be used for the plungers. The plungers provide a seal in the elongated slots 252 to prevent solder paste in the chamber from escaping through the slots 252.

The operation of the dispensing head 200 will now be described. The dispensing head 200 operates during a printing cycle in substantially the same manner as dispensing head 100 to print a pattern of solder paste, or some other substance, onto a substrate, such as a circuit board, using a stencil having the pattern defined thereon. At the conclusion of printing, pressurized air is provided to inlet ports 236 to retract each of the pistons 238 into the actuators and cause each of the plungers 240 to be raised in the elongated slots 252. When the plungers are raised, the effective volume of the chamber 210 increases creating a momentary vacuum condition in the chamber that draws the solder paste into the chamber. Prior to the start of printing on another substrate, pressurized air is provided to inlet ports 234 to extend each of the pistons from the actuators and cause the plungers to be lowered in the elongated slots 252.

In one embodiment of the present invention used for printing solder paste, the pistons and the plungers are moved a distance of approximately 0.125 inches between the extended and retracted positions. In this embodiment, the volume of the chamber increases by approximately 2% to 4% when the pistons are retracted. In other embodiments, depending on characteristics of the material being printed, and depending on the design of the chamber, it may be desirable to change the volume of the chamber by other values.

In the illustrative embodiment of the dispensing head 200 described above, four plungers with four actuators are used in the retraction assembly, and the housing includes two intermediate channels and four lower slots to accommodate the retraction assembly. In other embodiments, it may be desirable to use more or less plungers, actuators, intermediate channels and lower slots depending on the dimensions of the printing head and chamber. In addition, in other embodiments of the present invention, devices other than plungers may be used to expand the volume of the chamber.

In the illustrative embodiment described above, air actuators are used to extend and retract the pistons. As understood by those skilled in the art, in other embodiments, other mechanisms, such as electrical motors, could be used to move the pistons.

In embodiments of the present invention that do not include the dispensing head 200 with the retraction assembly, it has been found that solder paste can leak from the chamber after printing has occurred when the substrate is removed from the stencil. Solder paste that leaks from the chamber is at times able to flow between the stencil and the blades and undesirably collect on the back sides of the blades. The use of the retraction assembly to draw solder paste into the chamber after printing is effective in reducing the leaking of solder paste from the chamber.

U.S. Pat. No. 5,295,187, application Ser. No. 08/598,288, filed on Feb. 8, 1996, assigned in part to the assignee of the present application, and incorporated herein by reference, discloses a screen printer having a solder applicator that applies solder paste to a stencil. In one embodiment, the solder applicator includes a rotatable member that mixes solder paste in the solder applicator. Embodiments of the present invention may include a rotatable member within the chamber to assist in the mixing of solder paste in the chamber.

Embodiments of the present invention described above may also be incorporated in a dual track stencil printer such as those described in U.S. Pat. No. 5,873,939, application Ser. No. 08/802,934, filed Feb. 21, 1997, which is incorporated herein by reference.

Embodiments of the present invention described above include standard SEMCO cartridges for loading solder paste into th[0085] dispensing head. Other removable cartridges may be used in place of the SEMCO cartridges. However, it is desirable to use a standard replaceable cartridge.

The chamber of dispensing heads in embodiments of the present invention have been described as being cylindrical. The dispensing head need not be cylindrical, but rather, other shapes having a substantially circular cross-section to allow rolling of the solder paste within the chamber to create a substantially laminar flow may also be used. In addition, in one embodiment, the chamber is generally kidney-shaped, and the specific shape is programmable for controlling the flow of solder paste within the chamber based on the specific solder paste material used, the speed of the dispensing head across the stencil and based on any other factors.

Figure 15:
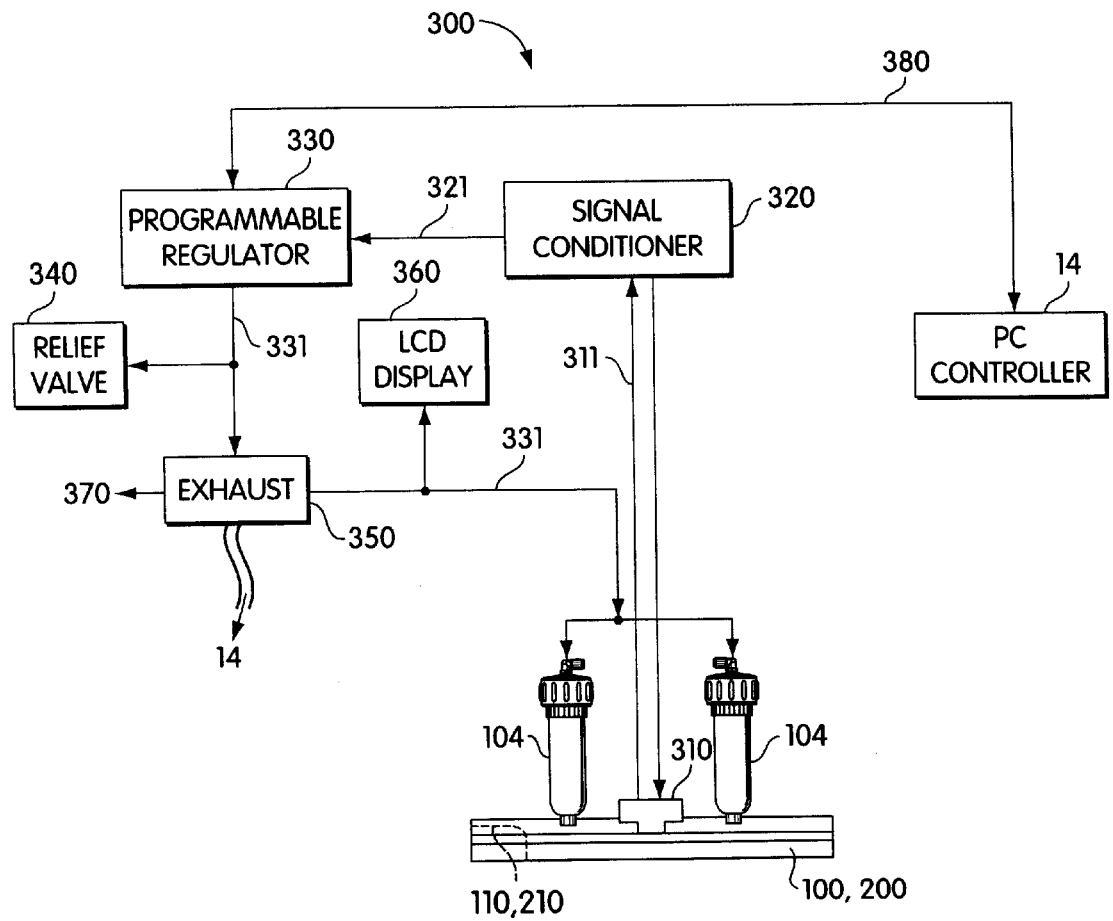
FIG. 15 shows a diagram of a closed loop pressure control system.

In another embodiment of the present invention, the pressure in the chamber of either dispensing head 100 or 200 is maintained by a closed loop pressure control system 300 based upon real-time measurement of pressure within the chamber during printing, as illustrated in FIG. 15. Maintaining consistent chamber pressure enables more precise control of the pressure at which the solder paste is applied through the stencil as the dispensing head traverses the stencil along the x axis, as defined by the coordinate axis system 23 of FIG. 1. Maintaining uniform chamber pressure during the stroke of the dispensing head results in more uniform application of solder paste and ultimately a higher quality solder print.

The closed loop pressure control system 300 illustrated in FIG. 15 includes a pressure transducer 310 to detect the pressure in the chamber 110 and 210, a signal conditioner 320, a programmable regulator 330, a pressure relief valve 340, a pressure exhaust valve 350, a pressure display 360, and the controller 14.

The pressure transducer 310 may be implemented using one of a number of transducers known in the art that detects the real-time pressure in the chamber at a multiple of predetermined desired time intervals, i.e., every 25 milliseconds, during dispensing. The pressure transducer transmits a signal over a control line 311 to the signal conditioner 320. The signal conditioner conditions the signal and transmits the signal over control line 321 to the programmable regulator 330. The programmable regulator compares the conditioned signal with a pressure set point value received from the controller 14 over control line 380. In response to a detected pressure differential, the programmable regulator adjusts the chamber pressure by increasing or decreasing the amount of pressurized air delivered over lines 331 to the cartridges 104 and ultimately to the chamber 110 and 210.

Prior to printing, the desired chamber pressure value is set in the controller 14 and received by the programmable regulator 330 over control line 380. The chamber is pressurized by applying a predetermined amount of pressurized air, i.e., 1 to 25 pounds per square inch (psi) to the cartridges, to achieve the preferred chamber pressure value, i.e., 1.0 to 3.0 psi. Printing is initiated and the desired chamber pressure value is maintained throughout the stroke of the dispensing head by in-process pressure measurement at each predetermined time interval and adjustment of the amount of pressure applied to the cartridges during the print stroke. Whenever the chamber pressure is below the desire pressure value during printing, a surge of pressure is momentarily applied to the cartridges to return the chamber pressure to the desired pressure value. Whenever the chamber pressure rises above the desired pressure value during printing, a reduction of pressure is momentarily applied to the cartridges to lower the chamber pressure to the desired pressure value. The closed loop feedback control of print pressure maintains the desired chamber pressure throughout the print stroke of the dispensing head.

The pressure relief valve 340 disposed on control line 331 relieves line pressure to prevent the application of pressure in excess of 25 psi to the cartridges and the dispensing head. The exhaust valve 350 expels pressurized line air to the atmosphere 370 when pressure is removed from the cartridges, particularly when the dispensing head has completed a print stroke or when the dispensing head is lifted from the stencil after printing is accomplished. The pressure display 360 may be an LCD display which indicates the real-time line pressure being applied to the cartridges.

Figure 16:
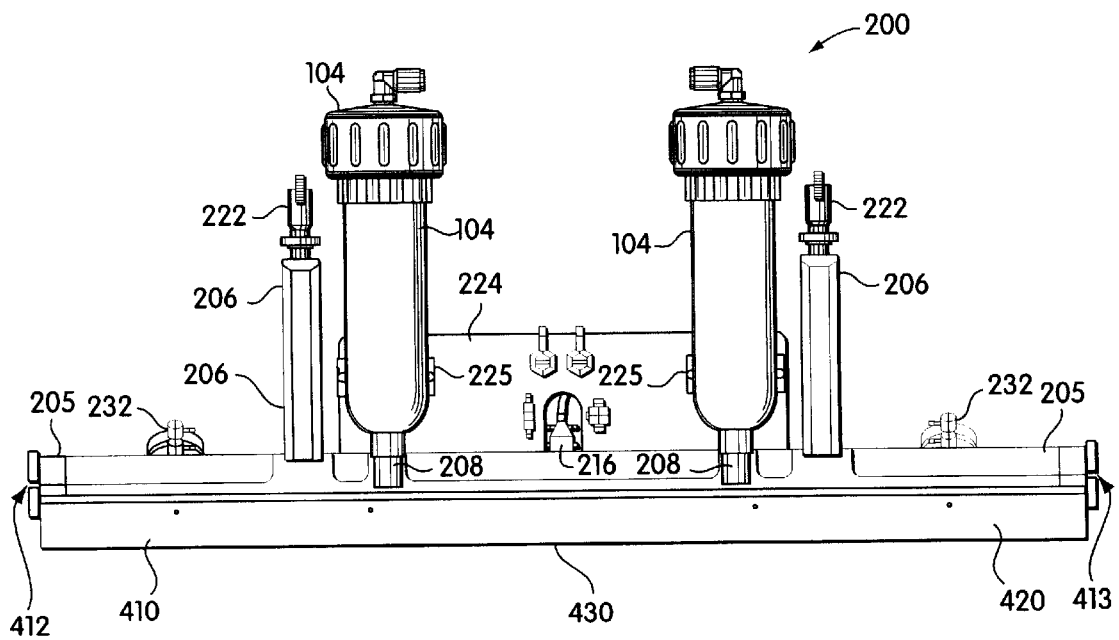
FIG. 16 shows a front view of an embodiment of the dispensing head with points of pressure drop indicated.
Figure 17:
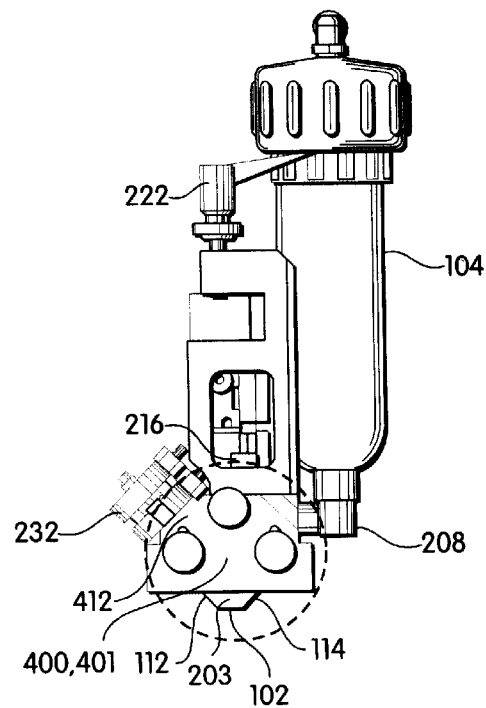
FIG. 17 shows a side view of the dispensing head of FIG. 16.
Figure 18:
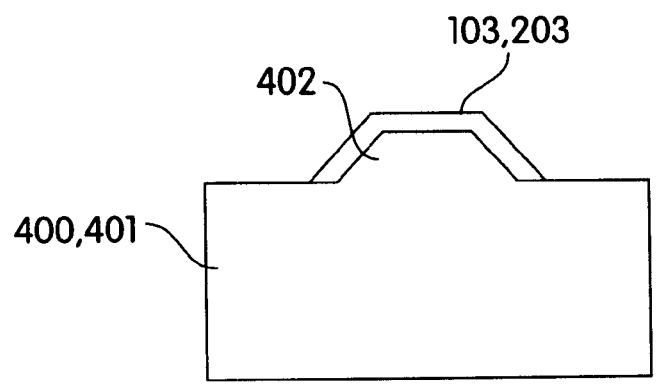
FIG. 18 shows a front view of an end cap coupled with a side dam.
Figure 19:
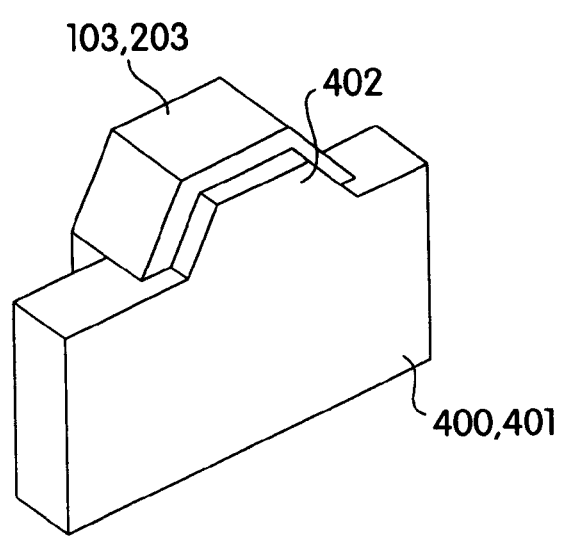
FIG. 19 shows a perspective view of the end cap coupled with the side dam.

In embodiments of the present invention, uniform pressure of either dispensing head 100 or 200 is also maintained throughout the effective length of the dispensing slot 102, which is along they axis as the dispensing head traverses the stencil. With reference to. FIGS. 15–19, pressure drops 410 and 420 occur adjacent each terminal end 412 and 413 of the dispensing slot 102 and at the center of the dispensing slot 430, which is at points farthest from and between the solder feed ports 108 and 208, as illustrated in FIG. 16. When pressure is applied to the cartridges, the side dams 103 and 203 at each end of the blades 112 and 114, as shown in FIG. 17, bend outward due to the compliant material with which they are constructed. Such outward compression of the side dams produces a pressure drop 410 and 420 at each terminal end 412 and 413 of the dispensing slot. End caps 400 and 401 connected to each terminal end 412 and 413 of the dispensing head adjacent to the side dams are used to seal each terminal end of the dispensing head. As shown in FIGS. 18 and 19, each end cap 400 and 401 includes a notch 402 which rests substantially adjacent to the upper portion of the side dams to prevent the side dams from being compressed outward as a result of applying pressure to the cartridges. The end caps 400 and 401 lend rigidity to the side dams to prevent outward compression, which effectively maintains the side dams in a stationary position, reducing the pressure differential along the length of the dispensing slot 102.

Maintaining pressure during the print stroke with the closed loop pressure control system described above and reducing the pressure differential along the length of the dispensing slot maintains uniform pressure along the x and y axes to effect two dimensional pressure control. Such two dimensional pressure control results in a more uniform application of solder paste and a higher quality solder print.

Figure 20:
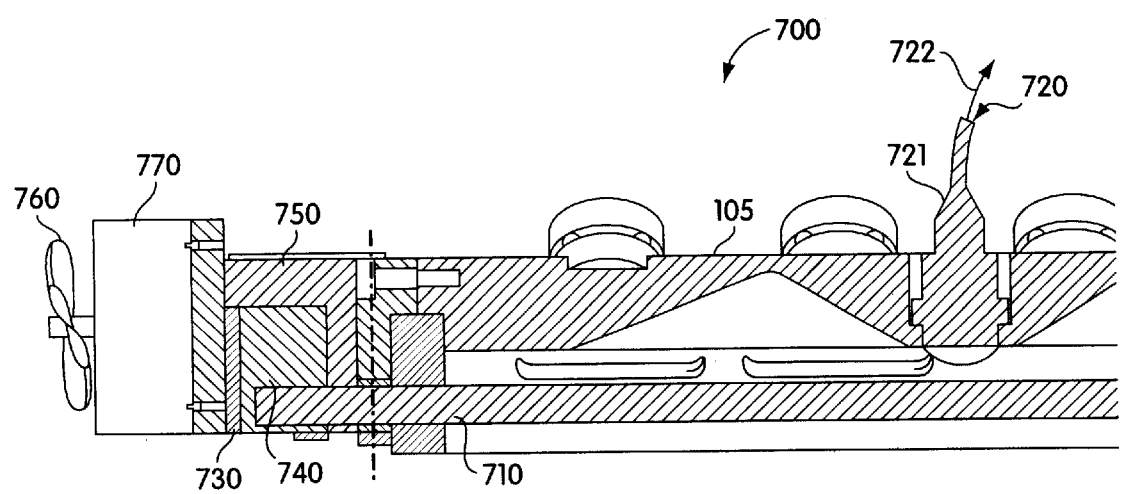
FIG. 20 shows a cross-sectional front view of an embodiment of the dispensing head with a temperature control system.
Figure 21:
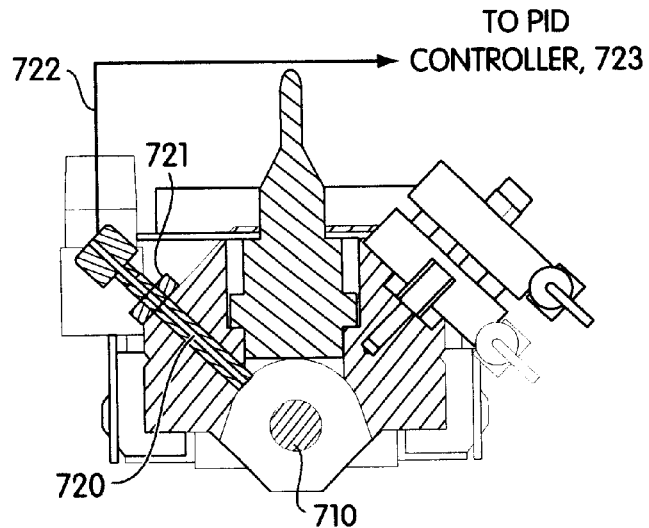
FIG. 21 shows a cross-sectional side view of an embodiment of the dispensing head with the temperature control system.
Figure 22:
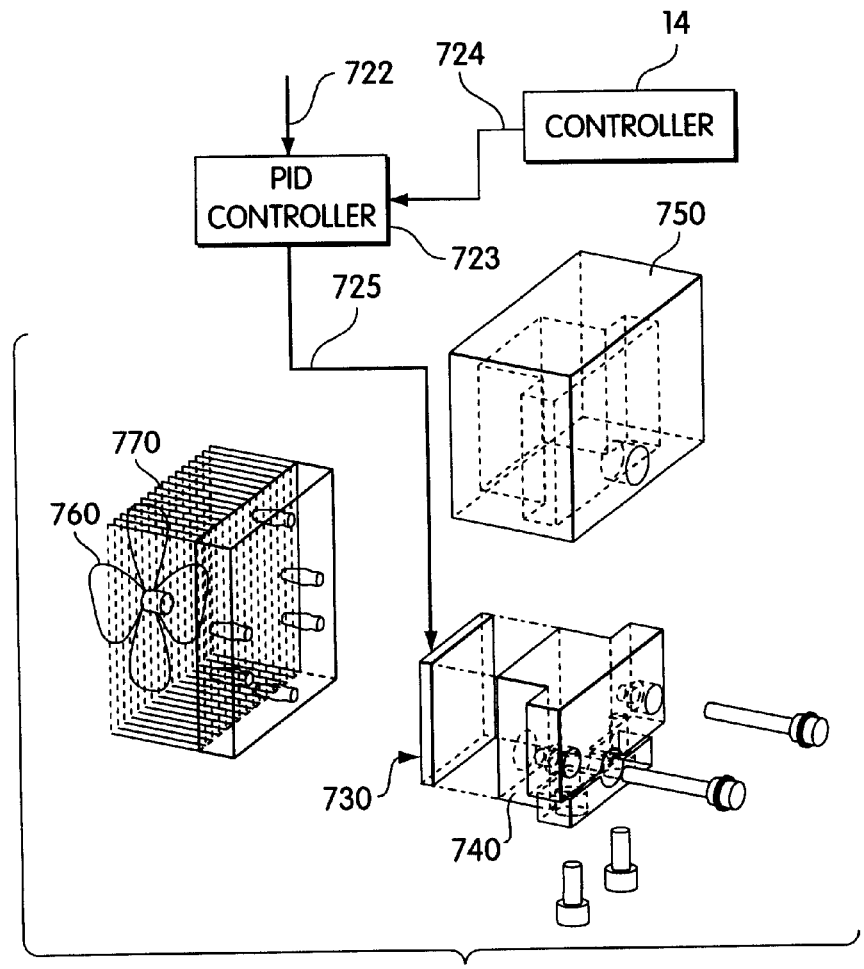
FIG. 22 shows a perspective view of components of the temperature control system.
Figure 23:
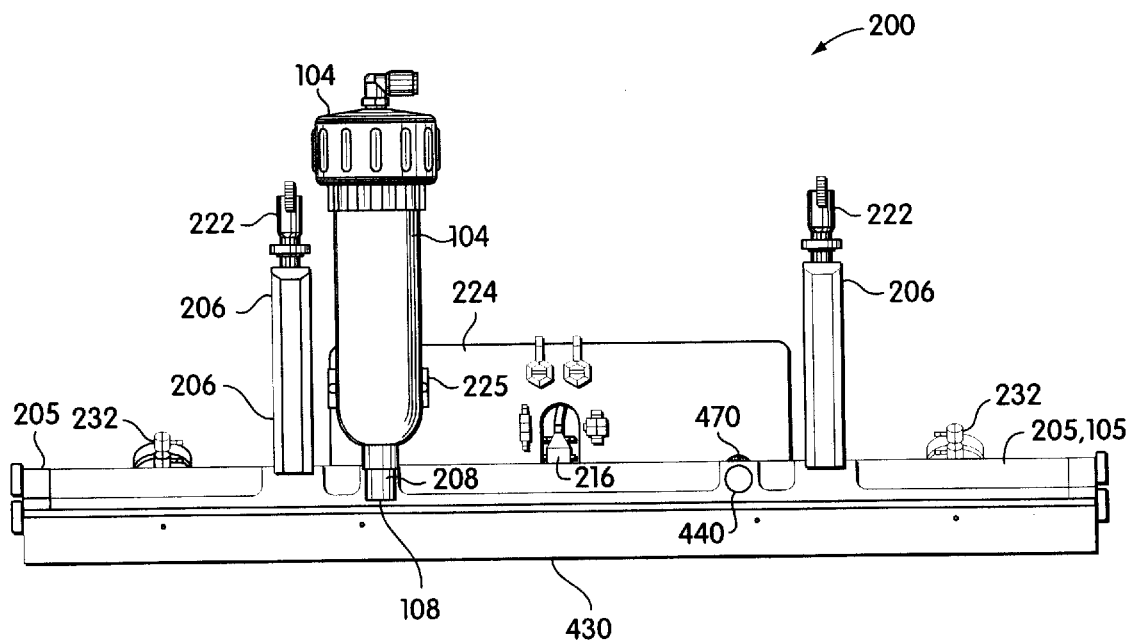
FIG. 23 shows a front view of an embodiment of the dispensing head with a cartridge port shown.
Figure 24:
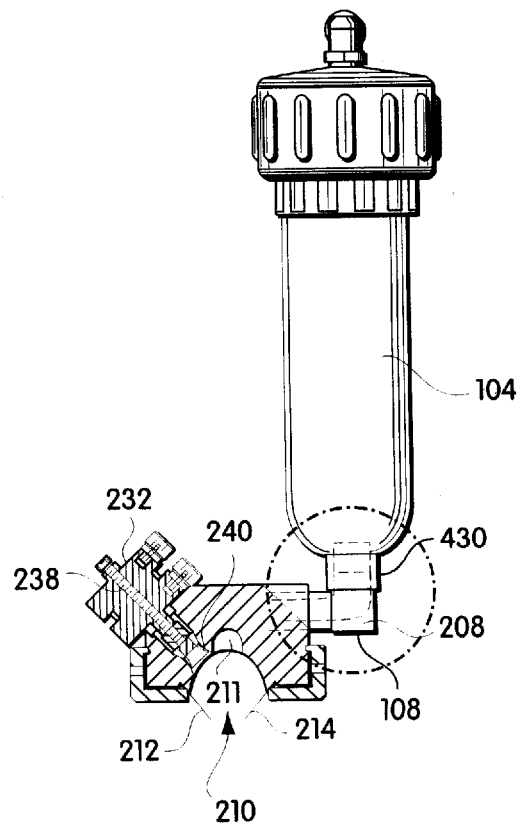
FIG. 24 shows a cross-sectional side view of the dispensing head of FIG. 23.

As illustrated in FIGS. 20–22, another embodiment of the present invention includes the dispensing head 100 or 200 with a temperature control system 700 for maintaining the temperature of solder paste contained in the chamber at a substantially constant value as set in the controller 14. The temperature control system comprises an elongated, insulated conduction rod 710 disposed in the chamber by coupling each end of the conduction rod to the side dam and the end cap. The temperature control system also includes a temperature thermistor 720 mounted to the housing 105 and connected to a PID controller 723, a thermal block 740 coupled to each end of the conduction rod, a Pelletier-type device 730 coupled to each thermal block 740, and a heat exchanger 770 with a cooling fan 760 coupled to each Pelletier-type device and mounted to each end of the housing. As illustrated in FIGS. 20 and 22, each Pelletier-type device 730 is coupled between a thermal block and a heat exchanger at each end of the conduction rod. As illustrated in FIG. 22, neoprene 750 is coupled to and surrounds each terminal end of the housing to insulate the conduction rod, the thermal block and the Pelletier-type device.

The temperature thermistor 720 and the PID controller 723 are a type well known in the art, such as the temperature controller and thermistor available from Wavelength Electronics, Bozeman, Mont., Part No. LFI-3751. The thermistor 720 is disposed within an insulated adapter 721 mounted to the dispensing head. The temperature of the solder paste is measured by the thermistor, which provides an output signal that is transmitted over control line 722 to the PID controller 723. The desired temperature value is set in the controller 14 prior to printing and is transmitted over control line 724 to the PID controller 723. In response to detection of a temperature differential from the desired set point value, the PID controller transmits an appropriate signal to each Pelletier-type device 730 to maintain temperature within an accuracy of ±0.2° C.

The Pelletier-type device 730 is a type well know in the art, such as the thermoelectric cooler available from Melcor, Trenton, N.J., Part No. CTL-0-127-08L. Depending upon the signal polarity and current received from the PID controller over control line 725, each Pelletier-type device either increases or decreases the thermal energy applied to the conduction rod 710 by applying heat to or removing heat from the thermal block 740 to which each Pelletier-type device is coupled.

The thermal block 740 functions as a coupling element between the thermoelectric cooler and the conduction rod and also may function to dissipate heat from the conduction rod. The heat exchanger 770 and cooling fan 760 remove heat from the dispensing head by forced convection cooling. Neoprene 750 insulates the temperature control components from the surrounding environment, as illustrated in FIG. 22, and assists in maintaining the chamber temperature at a desired value.

Figure 25:
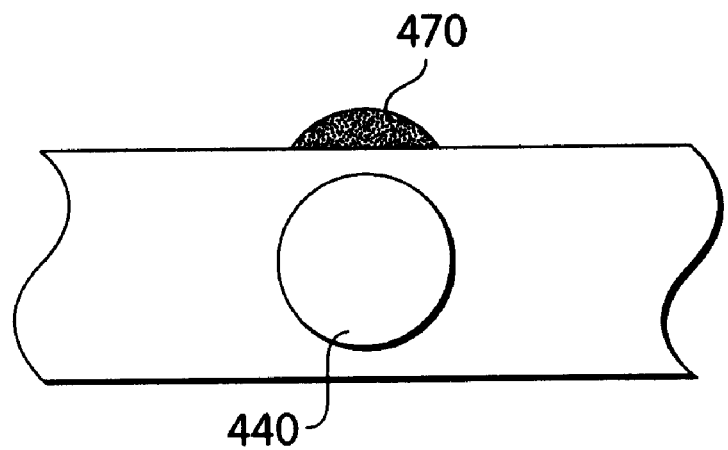
FIG. 25 shows a front view of a port of the dispensing head of FIG. 23.
Figure 26:
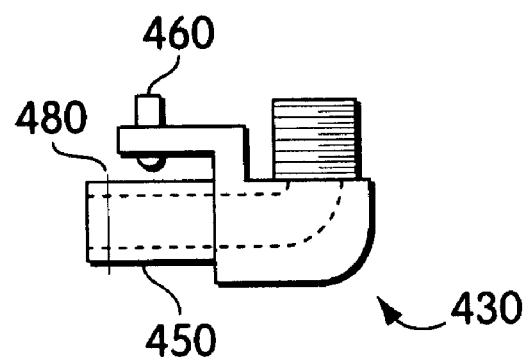
FIG. 26 shows a perspective of a removable cartridge fitting.

In another embodiment of the present invention, the dispensing head 100 or 200 includes at least one removable fitting 430 for quick and easy attachment of the cartridge 104 to the housing 205, as illustrated in FIGS. 23–26. The port 108 or 208 is configured and arranged to receive the removable fitting and includes smooth side walls 440 into which a smooth insert 450 of the removable fitting 430 is placed to mount the cartridge to the housing. As illustrated in FIGS. 25 and 26, the removable fitting includes a spring biased plunger 460 secured to the fitting, which couples with a stainless steel pad 470 permanently affixed to the housing 205 adjacent to the port to achieve a secure connection. An o-ring 480 is disposed on the insert to form a seal when the insert is placed into the smooth port. The removable fitting is an alternative to a threaded tap fitting and provides greater ease in removing the cartridge from the housing and cleaning the fitting insert and dispensing head port.

In addition, the removable fitting secures the cartridge in a vertically and horizontally consistent position in relation to the housing to maintain a consistent distance between the cartridge and the conductive proximity switch 225. As described above, the conductive proximity switch detects the level of solder paste in the cartridge to indicate when the paste level has dropped below a predetermined level. A threaded tap fitting used to mount the cartridge to the housing may not achieve consistent cartridge position between cartridges concurrently mounted on the dispensing head nor between manufacturing production runs. Differences in vertical and horizontal position in relation to the proximity switch can render measurement of the cartridge paste level erroneous, wherein paste levels below the predetermined level are not detected and paste levels above the predetermined level are indicated as insufficient to complete the printing run. The removable fitting eliminates such problems by maintaining consistent cartridge position and effectively providing more reliable paste level detection.

Figure 27:
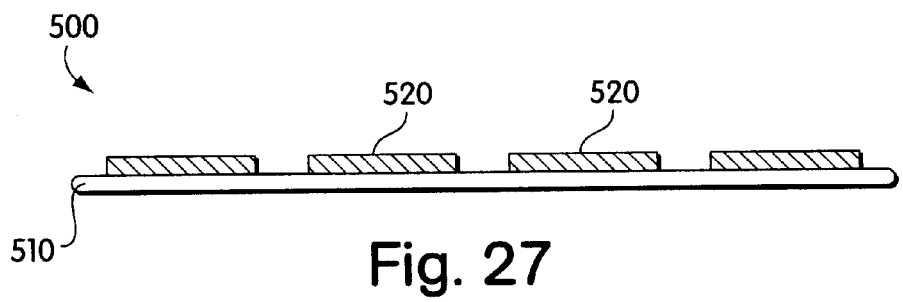
FIG. 27 shows a side view of a blocking assembly.
Figure 28:
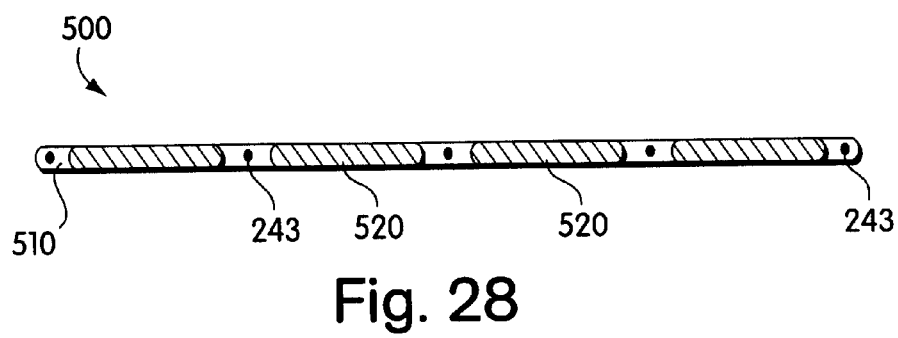
FIG. 28 shows a top view of the blocking assembly of FIG. 27.

In yet another embodiment of the present invention, as illustrated in FIGS. 27 and 28, an adhesive blocking assembly 500 is provided for use in the application of adhesives by either the dispensing head 100 or 200. When the dispensing head has stopped printing after adhesive has been applied, the residual pressure remaining in the chamber may cause adhesive to seep past the u-shaped plungers 240 and leak into lower slots 252 of housing 205, resulting in excessive residual adhesive. The adhesive blocking assembly replaces the solder paste retraction assembly 230 described above. The adhesive blocking assembly includes an elongated mounting bracket 510 with a plurality of plugs 520 mounted thereon. The plugs are approximately 1½ to 2 inches in length and approximately 5/16 inch in width. The number and dimensions of plugs vary and depend upon the dimensions of the dispensing head employed. The mounting bracket with corresponding plugs 520 is disposed within the housing 205 by coupling the mounting bracket to the housing using screws 243. When mounted, the adhesive blocking assembly conforms to the upper surface of the chamber to prevent leakage of adhesive from out of the chamber.

Figure 29:
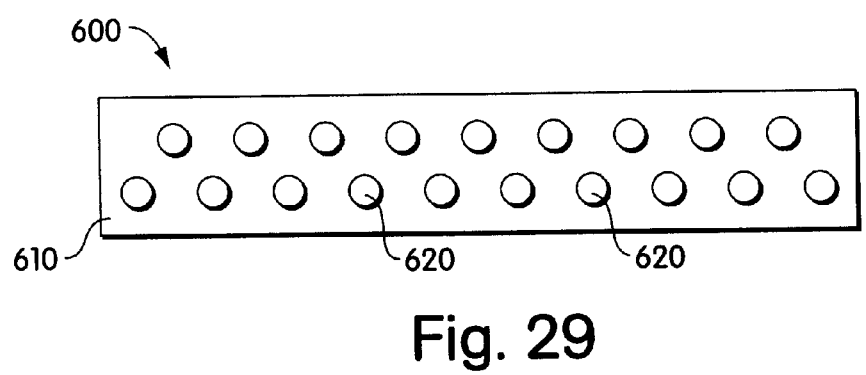
FIG. 29 shows a top view of a low viscosity material holding grate.
Figure 30:
FIG. 30 shows a side view of the grate of FIG. 29.
Figure 31:
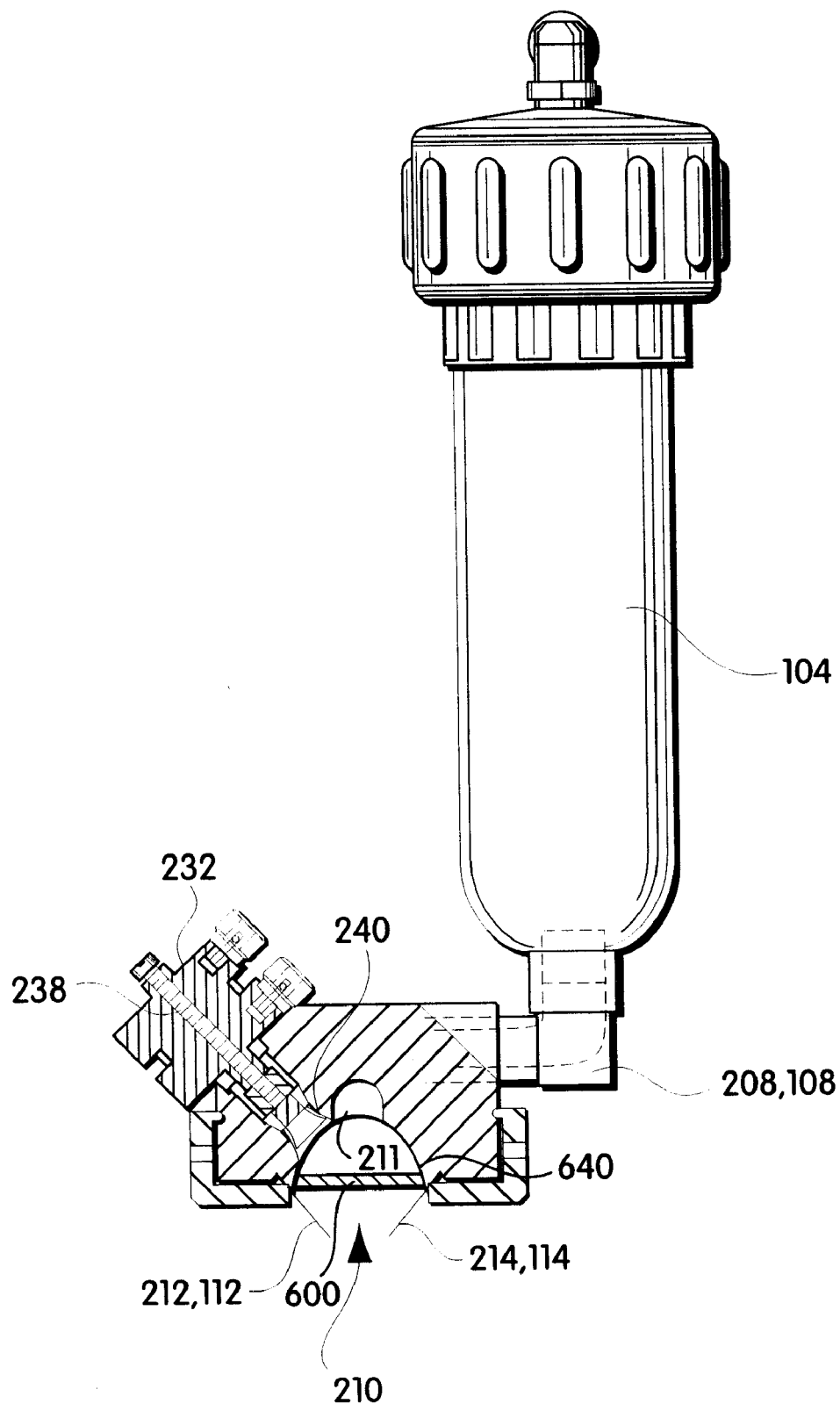
FIG. 31 shows a cross-sectional side view of the grate of FIG. 29 mounted to an embodiment of the dispensing head.

A further embodiment of the present invention is illustrated in FIGS. 29–31 and includes a low viscosity material holding plate 600 for use with either dispensing head 100 or 200 during stencil printing of low viscosity materials. As described above, when the dispensing head is lifted from the stencil at the conclusion of printing, the pressure is reduced and the effective volume of the chamber increased using the material retraction assembly 230. Increase in the volume of the chamber creates a negative pressure in the chamber to draw excess material into the chamber. However, less viscous materials do not respond as effectively to the negative chamber pressure and tend not to remain inside the chamber after the dispensing head is lifted, resulting in excess residual solder paste on the stencil.

As illustrated in FIGS. 29–31, the low viscosity material holding plate is an elongate, planar member 610 having an upper surface and a lower surface with a plurality of apertures or through-holes 620. The low viscosity material holding plate is mounted within the chamber by matching angled side edges 630 of the grate to an interface of a chamber side wall 640 and each blade 112 and 114. As illustrated in FIG. 31, the low viscosity grate is slid into the dispensing head 100 or 200 by matching side angles with the interface. The diameters of the apertures or through-holes are not limited and may be any diameter which is capable of preventing deposition of excessive low viscosity solder pastes upon removal of the dispensing head from the stencil.

Figure 32:
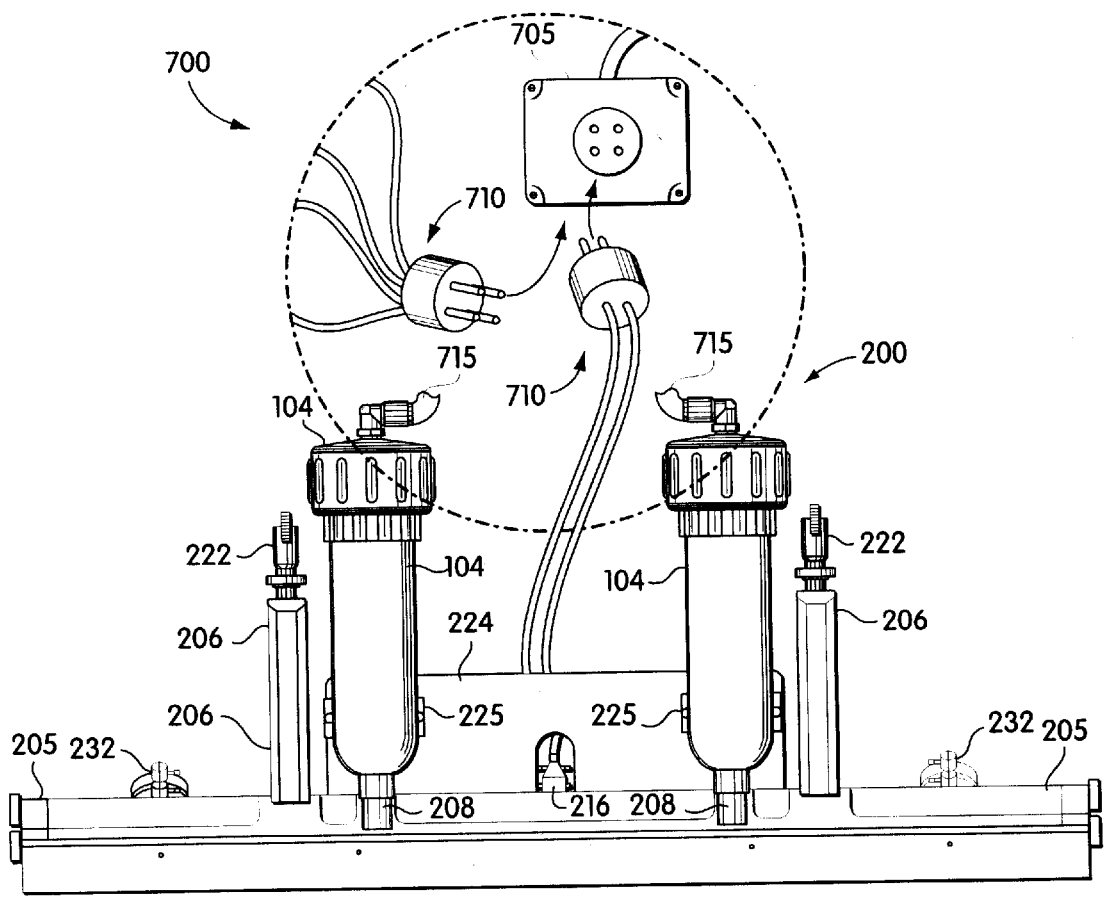
FIG. 32 shows a front view of an embodiment of the dispensing head with a bracket for interchanging dispensing heads.

In still another embodiment of the invention as shown in FIG. 32, the bracket 705 which is incorporated on the stencil printer 10 features a universal pressure connection configuration 700 which accepts male/female connectors 710 and 715 for lines delivering pressurized air to the cartridges 104 and the actuators 232. Such a connection 700 is universal in the sense that a first dispensing head, such as the dispensing head 100 or 200 of the present invention, may be quickly and easily replaced with a second dispensing head which is constructed and arranged to apply or print the viscous material to a substrate or a stencil with one or more squeegee blades coupled to the second dispensing head. The universal pressure connection permits the use of connectors 710 and 715 which are similarly constructed and arranged for use with different types of dispensing heads that incorporate different types of pneumatic assemblies and configurations, such as the dispensing head 100 or 200 of the present invention and the second dispensing head equipped with squeegee blades, as well as other dispensing heads incorporating other viscous material printing mechanisms. The universal pressure connection permits in-process replacement of dispensing heads and significantly reduces the time required to change from one type of dispensing head to another. Such quick replacement of dispensing heads results in less production downtime and greater efficiency of the stencil printer.

The dispensing head of embodiments of the present invention is described as being used with a stencil printer. Stencil printers such as the Ultraprint 3000 stencil printer and the AP Series stencil printer, both available from MPM Corporation of Franklin, Mass., can readily be adapted for use with embodiments of the present invention.

Embodiments of the present invention overcome problems associated with prior art stencil printers by providing dispensing heads and stencil printers that effectively remove excess solder paste from the stencil. In addition, the pressure applied to the solder paste to force it through apertures in the stencil is precisely controlled using a closed loop feedback system.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A printer for printing a viscous material at predetermined positions forming a pattern on a substrate, the printer comprising:

a frame;

a device, mounted to the frame, having a number of perforations arranged to form the pattern;

a support apparatus, coupled to the frame, that supports the substrate in printing position beneath the device;

a material dispenser having a chamber to contain the viscous material to be printed on the substrate, the chamber having an opening through which the viscous material is dispensed, the material dispenser being coupled to the frame, positioned over the device, and constructed and arranged to dispense the viscous material through the perforations in the device and onto the substrate, the material dispenser having a retraction device that prevents leakage of the viscous material from the opening after dispensing is complete, the material dispenser further having at least one port and a removable cartridge coupled to the port, the removable cartridge containing material to be dispensed and having an inlet to receive pressurized air to force material from the cartridge through the port and out of the opening of the chamber; and a temperature control system to control the temperature of the viscous material contained in the chamber.

2. The printer of claim 1, wherein the temperature control system comprises:

a temperature sensor disposed on the material dispenser to measure temperature of the viscous material contained in the chamber, and a controller coupled to the temperature sensor to control a temperature of a heating and cooling element disposed in the chamber to maintain the temperature of the viscous material at a desired value.

3. The printer of claim 2, wherein the heating and cooling element is an elongated conduction rod disposed in the chamber having a first terminal end and a second terminal end and of a length sufficient to control temperature of the viscous material contained within the chamber.

4. The printer of claim 3, further comprising a first thermoelectric device coupled to the controller and disposed at a first terminal end of the conduction rod to control the temperature of the conduction rod.

5. The printer of claim 4, further comprising a first thermal block coupled between the first thermoelectric device and the conduction rod to transfer heat to the conduction rod from the first thermoelectric device.

6. The printer of claim 5, further comprising a second thermoelectric device coupled to the controller and disposed at a second terminal end of the conduction rod to control the temperature of the conduction rod.

7. The printer of claim 6, further comprising a second thermal block coupled between the second thermoelectric device and the conduction rod to transfer heat to the conduction rod from the second thermoelectric device.

8. The printer of claim 7, further comprising a heat exchanger coupled to each of the first and second thermoelectric devices and having a fan mounted thereon for cooling.

9. The printer of claim 1, wherein the material dispenser includes at least one port to receive pressurized air to provide pressure to the chamber to force the viscous material through the opening of the chamber.

10. The printer of claim 1, wherein the material dispenser includes a pressure control system to control on a real-time basis the pressurized air delivered to the cartridge to maintain the pressure with which the viscous material is forced from the cartridge and to maintain the pressure in the chamber at a desired value during dispensing.

11. The printer of claim 10, wherein the pressure control system comprises:
a pressure sensor to measure the pressure in the chamber at at least one time interval as the material dispenser moves along a first axis across the device during dispensing; and
a programmable regulator coupled to the pressure sensor to receive real-time pressure values, wherein the programmable regulator maintains or adjusts after the at least one time interval an amount of pressurized air delivered to the cartridge to maintain the pressure at which the viscous material is forced from the cartridge and to maintain the pressure in the chamber at the desired value.

12. The printer of claim 11, wherein the at least one time interval at which the pressure in the chamber is measured by the pressure sensor is approximately at least 25 milliseconds.

13. The printer of claim 11, further comprising a bracket mounted to the frame of the printer having at least a first connector constructed and arranged to receive at least a second connector attached to the material dispenser which receives pressurized air from the programmable regulator of the printer, wherein removal of the second connector from the first connector permits the pressure control system to be disconnected from the material dispenser.

14. The printer of claim 1, wherein the removable cartridge is connected to the material dispenser by a removable fitting which includes a smooth insert having a spring-biased plunger, the insert configured and arranged for insertion into a port with smooth side wall surfaces disposed in a portion of the material dispenser above the chamber, and the plunger configured and arranged to couple to a pad disposed above the port to achieve a secure connection to the material dispenser.

15. A printer for printing a viscous material at predetermined positions forming a pattern on a substrate, the printer comprising:
a frame;
a device, mounted to the frame, having a number of perforations arranged to form the pattern;
a support apparatus, coupled to the frame, that supports the substrate in printing position beneath the device;
a material dispenser having a chamber to contain the viscous material to be printed on the substrate, the chamber having an opening through which the viscous material is dispensed, the material dispenser being coupled to the frame, positioned over the device, and constructed and arranged to dispense the viscous material through the perforations in the device and onto the substrate, the material dispenser further having at least one port and a removable cartridge coupled to the port, the removable cartridge containing material to be dispensed and having an inlet to receive pressurized air to force material from the cartridge through the port and out of the opening of the chamber; and
a device to prevent leakage of the viscous material from the chamber after the material dispenser is lifted from the substrate.

16. The printer of claim 15, wherein the device to prevent leakage of the viscous material from the chamber is a blocking assembly disposed in the chamber which includes a mounting bracket to couple the blocking assembly to the chamber and at least one plug mounted thereon to conform to an upper portion of the chamber.

17. The printer of claim 15, wherein the device to prevent leakage of the viscous material from the chamber is a material holding plate disposed in the chamber which includes an elongate, planar member having an upper surface and a lower surface with a plurality of through-holes.

18. The printer of claim 15, wherein the material dispenser further includes a pressure control system to control on a real-time basis the pressurized air delivered to the cartridge to maintain the pressure with which the viscous material is forced from the cartridge and to maintain the pressure in the chamber at a desired value during dispensing.

19. The printer of claim 18, wherein the pressure control system comprises:
a pressure sensor to measure the pressure in the chamber at at least one predetermined time interval as the material dispenser moves along a first axis across the device during dispensing; and
a programmable regulator coupled to the pressure sensor to receive real-time pressure values, wherein the programmable regulator controller maintains or adjusts after the predetermined time interval an amount of pressurized air delivered to the cartridge to maintain the pressure at which the viscous material is forced from the cartridge and to maintain the pressure in the chamber at the desired value.

20. The printer of claim 19, wherein the at least one time interval at which the pressure in the chamber is measured by the pressure sensor is approximately at least 25 milliseconds.

21. A method of controlling temperature of a viscous material to be printed by a material dispenser of a printer at predetermined positions on a substrate forming a pattern, the material dispenser being constructed and arranged to print the viscous material on the substrate and having a chamber in which the viscous material is contained with an inlet to receive the viscous material and an opening through which the viscous material is dispensed to the substrate, the method comprising the steps of:

measuring a temperature of the viscous material contained in the chamber of the material dispenser;

detecting a differential between a value of the measured temperature and a value of a desired temperature; and adjusting the temperature of the viscous material by applying a sufficient amount of heat to a conduction rod disposed within the chamber to maintain the desired temperature; and reducing the temperature of the viscous material to maintain the desired temperature by removing a sufficient amount of heat from the conduction rod by forced convection.

22. The method of claim 21, wherein temperature of the viscous material contained in the chamber is controlled to +/−0.2° C. of a desired value.

23. A printer for printing a viscous material at predetermined positions forming a pattern on a substrate, the printer comprising:

a frame;

a device, mounted to the frame, having a number of perforations arranged to form the pattern;

a support apparatus, coupled to the frame, that supports the substrate in printing position beneath the device;

a material dispenser having a chamber to contain the viscous material to be printed on the substrate, the chamber having an opening through which the viscous material is dispensed, the material dispenser being coupled to the frame, positioned over the device, and constructed and arranged to dispense the viscous material through the perforations in the device and onto the substrate, the material dispenser having a retraction device that prevents leakage of the viscous material from the opening after dispensing is complete; and a temperature control system to control the temperature of the viscous material contained in the chamber, the temperature control system including a temperature sensor disposed on the material dispenser to measure temperature of the viscous material contained in the chamber, and a controller coupled to the temperature sensor to control a temperature of a heating and cooling element disposed in the chamber to maintain the temperature of the viscous material at a desired value, wherein the heating and cooling element includes a conduction rod disposed in the chamber having a first terminal end and a second terminal end and of a length sufficient to control temperature of the viscous material contained within the chamber.

24. The printer of claim 23, further comprising a first thermoelectric device coupled to the controller and disposed at a first terminal end of the conduction rod to control the temperature of the conduction rod, and a first thermal block coupled between the first thermoelectric device and the conduction rod to transfer heat to the conduction rod from the first thermoelectric device.

25. The printer of claim 24, further comprising a second thermoelectric device coupled to the controller and disposed at a second terminal end of the conduction rod to control the temperature of the conduction rod, and a second thermal block coupled between the second thermoelectric device and the conduction rod to transfer heat to the conduction rod from the second thermoelectric device.

26. The printer of claim 25, further comprising a heat exchanger coupled to each of the first and second thermoelectric devices and having a fan mounted thereon for cooling.

27. A printer for printing a viscous material at predetermined positions forming a pattern on a substrate, the printer comprising:

a frame;

a device, mounted to the frame, having a number of perforations arranged to form the pattern;

a support apparatus, coupled to the frame, that supports the substrate in printing position beneath the device;

a material dispenser having a chamber to contain the viscous material to be printed on the substrate, the chamber having an opening through which the viscous material is dispensed, the material dispenser being coupled to the frame, positioned over the device, and constructed and arranged to dispense the viscous material through the perforations in the device and onto the substrate, the material dispenser having a retraction device that prevents leakage of the viscous material from the opening after dispensing is complete, the material dispenser further having at least one port and a removable cartridge coupled to the port, the removable cartridge containing material to be dispensed and having an inlet to receive pressurized air to force material from the cartridge through the port and out of the opening of the chamber; and a pressure control system to control on a real-time basis the pressurized air delivered to the cartridge to maintain the pressure with which the viscous material is forced from the cartridge and to maintain the pressure in the chamber at a desired value during dispensing.

28. The printer of claim 27 wherein the pressure control system comprises a pressure sensor to measure the pressure in the chamber at at least one time interval as the material dispenser moves along a first axis across the device during dispensing, and a programmable regulator coupled to the pressure sensor to receive real-time pressure values wherein the programmable regulator maintains or adjusts after the at least one time interval an amount of pressurized air delivered to the cartridge to maintain the pressure at which the viscous material is forced from the cartridge and to maintain the pressure in the chamber at the desired value.

29. The printer of claim 28, wherein the at least one time interval at which the pressure in the chamber is measured by the pressure sensor is approximately at least 25 milliseconds.

30. The printer of claim 27 further comprising a bracket mounted to the frame of the printer having at least a first connector constructed and arranged to receive at least a second connector attached to the material dispenser wherein removal of the second connector from the first connector permits the pressure control system to be disconnected from the material dispenser.

* * * * *